United States Patent
Camm et al.

(10) Patent No.: US 6,941,063 B2
(45) Date of Patent: Sep. 6, 2005

(54) HEAT-TREATING METHODS AND SYSTEMS

(75) Inventors: David Malcolm Camm, Vancouver (CA); J. Kiefer Elliott, Austin, TX (US)

(73) Assignee: Mattson Technology Canada, Inc., Vancouver (CA)

(*) Notice: Subject to any disclaimer, the term of this patent is extended or adjusted under 35 U.S.C. 154(b) by 28 days.

(21) Appl. No.: 10/005,186

(22) Filed: Dec. 4, 2001

(65) Prior Publication Data

US 2002/0102098 A1 Aug. 1, 2002

Related U.S. Application Data

(63) Continuation-in-part of application No. 09/729,747, filed on Dec. 4, 2000.

(30) Foreign Application Priority Data

May 30, 2001 (WO) .............................. PCT/CA01/00776

(51) Int. Cl.[7] .............................................. F26B 19/00
(52) U.S. Cl. ....................... 392/416; 392/418; 392/423; 392/424; 219/390; 219/405; 219/411; 118/724; 118/725
(58) Field of Search ................................ 219/390, 405, 219/411, 388; 392/416, 418, 423, 424; 118/724, 725, 50.1

(56) References Cited

U.S. PATENT DOCUMENTS

| 1,587,023 | A | 6/1926 | Mottlau |
|---|---|---|---|
| RE24,296 | E | 3/1957 | Stewart |
| 2,981,819 | A | 4/1961 | Gregory |
| 3,047,438 | A | 7/1962 | Marinace |
| 3,108,713 | A | 10/1963 | Barrett et al. |
| 3,160,517 | A | 12/1964 | Jenkin |
| 3,188,459 | A | 6/1965 | Bridwell |
| 3,227,065 | A | 1/1966 | Litman |
| 3,239,651 | A | 3/1966 | Silberman |
| 3,240,915 | A | 3/1966 | Carter et al. |
| 3,460,510 | A | 8/1969 | Currin |
| 3,502,516 | A | 3/1970 | Henker |

(Continued)

FOREIGN PATENT DOCUMENTS

| EP | 0 105 230 | | 4/1984 |
|---|---|---|---|
| EP | 0 399 662 | A2 | 11/1990 |
| EP | 0 538 874 | | 4/1993 |
| EP | 0 598 409 | | 5/1994 |
| GB | 938699 | | 12/1960 |
| GB | 2065973 | A | 7/1981 |
| GB | 2 199 693 | | 7/1988 |

(Continued)

OTHER PUBLICATIONS

J. Lue, "Arc Annealing of BF+2 Implanted Silicon by a Short Pulse Flash Lamp," Appl. Phys. Lett., vol. 36, No. 1, pp. 73–76, dated Jan. 1, 1980.

(Continued)

Primary Examiner—Shawntina Fuqua
(74) Attorney, Agent, or Firm—Knobbe, Martens, Olson & Bear, LLP

(57) ABSTRACT

A method involves pre-heating a workpiece to an intermediate temperature, heating a surface of the workpiece to a desired temperature greater than the intermediate temperature, and enhancing cooling of the workpiece. Enhancing cooling may involve absorbing radiation thermally emitted by the workpiece. An apparatus includes a first heating source for heating a first surface of a semiconductor wafer, a second heating source for heating a second surface of the semiconductor wafer, and a first cooled window disposed between the first heating source and the semiconductor wafer.

118 Claims, 9 Drawing Sheets

U.S. PATENT DOCUMENTS

| | | | |
|---|---|---|---|
| 3,623,712 A | 11/1971 | McNeilly et al. | |
| 3,627,590 A | 12/1971 | Mammel | |
| 3,661,637 A | 5/1972 | Sirtl | |
| 3,692,572 A | 9/1972 | Strehlow | |
| 3,836,751 A | 9/1974 | Anderson | |
| 3,913,872 A | 10/1975 | Weber | |
| 4,041,278 A | 8/1977 | Boah | |
| 4,081,313 A | 3/1978 | McNeilly et al. | |
| 4,097,226 A | 6/1978 | Erikson et al. | |
| 4,101,759 A | 7/1978 | Anthony et al. | |
| 4,115,163 A | 9/1978 | Gorina et al. | |
| 4,151,008 A * | 4/1979 | Kirkpatrick | 438/799 |
| 4,164,643 A | 8/1979 | Peart et al. | |
| 4,220,483 A | 9/1980 | Cazcarra | |
| 4,224,096 A | 9/1980 | Osborne | |
| 4,233,493 A | 11/1980 | Nath | |
| 4,308,078 A | 12/1981 | Cook | |
| 4,315,130 A | 2/1982 | Inagaki et al. | |
| 4,325,006 A | 4/1982 | Morton | |
| 4,331,485 A | 5/1982 | Gat | |
| 4,370,175 A | 1/1983 | Levatter | |
| 4,375,993 A | 3/1983 | Mori et al. | |
| 4,379,727 A | 4/1983 | Hansen et al. | |
| 4,398,094 A | 8/1983 | Hiramoto | |
| 4,421,048 A | 12/1983 | Adema et al. | |
| 4,431,459 A | 2/1984 | Teng | |
| 4,455,479 A | 6/1984 | Itoh et al. | |
| 4,493,977 A | 1/1985 | Arai et al. | |
| 4,533,820 A | 8/1985 | Shimizu | |
| 4,539,431 A | 9/1985 | Moddel et al. | |
| 4,540,876 A | 9/1985 | McGinty | |
| 4,550,245 A | 10/1985 | Arai et al. | |
| 4,550,684 A | 11/1985 | Mahawili | |
| 4,567,352 A | 1/1986 | Mimura et al. | |
| 4,649,261 A | 3/1987 | Sheets | |
| 4,680,447 A | 7/1987 | Mahawili | |
| 4,698,486 A | 10/1987 | Sheets | |
| 5,219,786 A * | 6/1993 | Noguchi | 438/5 |
| 5,336,641 A | 8/1994 | Fair et al. | |
| 5,359,693 A | 10/1994 | Nenyei et al. | 392/418 |
| 5,399,506 A | 3/1995 | Tsukamoto | |
| 5,446,825 A | 8/1995 | Moslehi et al. | |
| 5,561,735 A * | 10/1996 | Camm | 392/416 |
| 5,628,564 A | 5/1997 | Nenyei et al. | 374/121 |
| 5,727,017 A | 3/1998 | Maurer et al. | 374/9 |
| 5,777,437 A | 7/1998 | Neister | |
| 5,841,110 A | 11/1998 | Nenyei et al. | 219/497 |
| 5,908,307 A | 6/1999 | Talwar et al. | |
| 5,960,158 A * | 9/1999 | Gat et al. | 392/416 |
| 5,971,565 A * | 10/1999 | Zapata et al. | 362/294 |
| 6,051,483 A | 4/2000 | Lee et al. | |
| 6,066,516 A | 5/2000 | Miyasaka | |
| 6,187,616 B1 | 2/2001 | Gyoda | |
| 6,293,696 B1 | 9/2001 | Guardado | 374/2 |
| 6,303,411 B1 * | 10/2001 | Camm et al. | 438/149 |
| 2004/0105670 A1 | 6/2004 | Kusuda et al. | |
| 2004/0112890 A1 | 6/2004 | Kusuda et al. | |

FOREIGN PATENT DOCUMENTS

| | | |
|---|---|---|
| JP | 55-115327 | 9/1980 |
| JP | 56-48128 | 5/1981 |
| JP | 0080729 | 5/1982 |
| JP | 57-208146 | 12/1982 |
| JP | 58-070536 | 4/1983 |
| JP | 58-106836 | 6/1983 |
| JP | 59-211221 | 11/1984 |
| JP | 01-246828 | 10/1989 |
| JP | 02294027 A | 5/1990 |
| JP | 04-355911 | 12/1992 |
| JP | 07-245274 | 9/1995 |
| JP | 08-107113 | 4/1996 |
| NO | 32864 | 8/1921 |
| WO | WO 99/41777 | 8/1999 |
| WO | WO 00/67298 | 11/2000 |

OTHER PUBLICATIONS

M. Lefrancois and D. Camm, "Temperature Uniformity During Impulse ™ Anneal," 8th International Conference on Advanced Thermal Processing of Semiconductors, RTP 2000, pp. 1–6, dated Sep. 20–22, 2000.

A.T. Fiory, K.K. Bourdelle, P.K. roy and S.P. McCoy, "Spike Annealing of Implanted PMOS Gates," Proc. of RTP 2000 Conference, pp. 1–8, dated Sep. 20–22, 2000.

D.M. Camm and B. Lojek, "High Power Arc Lamp RTP System for High Temperature Annealing Applications," 2nd International Rapid Thermal Conference, pp. 1–7, (1994).

A.T. Fiory, K.K. Bourdelle, M.E. Lefrancois, D.M. Camm and A. Agarwal., "Electrical Measurements of Annealed Boron Implants for Shallow Junctions," Advances in Rapid Thermal Processing, vol. 99–10, pp. 133–140, (1999).

D.M. Camm and M. Lefrancois, "Spike Thermal Processing Using Arc Lamps," Advances in Rapid Thermal Processing, (2000).

A.T. Fiory, D.M. Camm, M.E. Lefrancois, S.P. McCoy and A. Agarwal, "Annealing Ultra–Low Energy Boron Implants with an Arc Lamp System," RTP 1999, pp. 273–280 (1999).

Semiconductor Industry Association, "International Technology Roadmap for Semiconductors," International Sematech, Austin Texas, pp. 7, 14, pp. 123–131, (1999).

"Products, Capabilities," Temarach Scientific Co., Inc.

"Searchlight Model–100," Tamarack Scientific Co., Inc.

A.R. Lunde, "Nasa Tech Brief," B75–1008, Lewis Research Center, dated Apr. 1975.

"Transient Calorimeter Calibration System," AFFDL–TR–75–24, Tamarack Scientific Company, Orange, California, pp. 1–50, dated Mar. 1975.

N.S. Kapany, J.A. Eyer and R.E. Keim, "Fiber Optics. Part II. Image Transfer on Static and Dynamic Scanning with Fiber Bundles," Journal of the Optical Society of America, vol. 47, No. 5, pp. 423–427, dated May 1957.

R. J. Potter, "Transmission Properties of Optical Fibers," Journal of the Optical Society of America, vol. 51, No. 10, pp. 1079–1089, dated Oct. 1961.

D. E. Williamson, "Cone Channel Condenser Optics," Journal of the Optical Society of America, vol. 42, No. 10, pp. 712–715, dated Oct. 1952.

R.L. Cohen, J.S. Williams, L.C. Feldman and K.W. West, Thermally Assisted Flash Annealing of Silicon and Germanium, Bell Laboratories, Murray Hill, New Jersey, pp. 1–4.

R.J. von Gutfeld, "Crystallization of Silicon for Solar Cell Applications," IBM Technical Disclosure, vol. 19, IBM Corp., pp. 3955–3956, dated Mar. 1977.

T.O. Sedgwick, "Short Time Annealing," J. Electrochem. Soc., vol. 130, No. 2, pp. 484–492, dated Feb. 1983.

P. S. Burggraaf, "Rapid Wafer Heating: Status 1983," Semiconductor International, pp. 69–74, dated Dec. 1983.

A. Gat and S. Shatas, "Introduction to Heatpulse ™ Processing Technology," AG Associates, Moutain View, California, pp. 1–29.

J. C. Gelpey and P. O. Stump, "Rapid Optical Annealing Using the Water–Wall DC Arc Lamp," Microelectronic Manufacturing and Testing, pp. 22–24, dated Aug. 1983.

M.M. Chen, J.B. Berkowitz–Mattuck and P.E. Glaser, "*The Use of a Kaleidoscope to Obtain Uniform Flux Over a Large Area in a Solar or Arc Imaging Furnace*," Applied Optics, vol. 2, No. 3, pp. 265–271, dated Mar. 1983.

R. Klabes, J. Matthai, M. Voelskow and S. Mutze, "*Pulsed Incoherent Light Annealing of Arsenic and Phosphorous Implanted Polycrystalline Silicone*," Physica Status Solidi, pp. K5–7, K9–12 (1982).

A. Lietoila, R.B. Gold and J.F. Gibbons, "*Temperature Rise Induced in Si by Continuous Xenon Arc Lamp Radiation*," American Institute of Physics, vol. 53, No. 2, pp. 1169–1172, dated Feb. 1982.

R.A. Powell and R.T. Fulks, "*Annealing of Implantation Damage in Integrated–Circuit Devices Using an Incoherent Light Source*," American Vacuum Society, pp. 32–36, dated Jan. 1982.

J.C. Gelpey, P.O. Stump and J.W. Smith, "*Process Control for a Rapid Optical Annealing System*," Mat. Res. Soc. Symp. Press, vol. 52 (1986).

J.H. Myer, "*Zoomable Kaleidoscopic Mirror Tunnel,*" Applied Optics, vol. 10, No. 9, pp. 2179–2182, dated Sep. 1971.

"*RTP–800 Rapid Thermal Processor*," Extrion Division Semiconductor Equipment Group, Varian, pp. 1–6, dated Dec. 1985.

K. Nishiyama, M. Arai and N. Watanabe, "*Radiation Annealing of Boron–Implanted Silicon with a Halogen Lamp*," Japanese Journal of Applied Physics, vol. 19, No. 10, pp. L563–L566, dated Oct. 1980.

M. Current and A. Yee, "*Ion Implantation and Rapid Annealing of 125 mm Wafers*," Solid State Technology, pp. 197–202, dated Oct. 1983.

D.J. Lischner and G.K. Celler, "*Rapid Large Area Annealing of Ion–Implanted Si with Incoherent Light*," Laser and Electron–Beam Interactions with Solids, Elsevier Science Publishing Company, Inc., pp. 751–758, (1982).

J.C. C. Fan, B–& Tsaur and M.W. Gels, "*Transient Heating with Graphite Heaters for Semiconductor Processing*," Laser and Electron–Beam Interactions with Solids, Elsevier Science Publishing Company, Inc., pp. 751–758 (1982).

R.L. Cohen, J.S. Williams, L.C. Feldman and K.W. West, "*Thermally Assisted Flash Annealing of Silicon and Germanium*," Appl. Phys. Lett., vol. 33, No. 8, pp. 751–753, dated Oct. 1978.

H.A. Bomke, H.L. Berkowitz, M. Harmatz, S. Kronenberg and R. Lux, "*Annealing of Ion–Implanted Silicon by an Incoherent Light Pulse*," Appl. Phys. Lett., vol. 33, No. 11, pp. 955–957, dated Dec. 1, 1978.

R.A. Powell, T.O. Yep and R.T. Fulke, "*Activation of Arsenic–Implanted Silicon Using an Incoherent Light Source*," Appl. Phys. Lett., vol. 39, No. 2, pp. 150–152, dated Jul. 15, 1981.

R.E. Sheets, "*Automatic Cassette to Cassette Radiant Impulse Processor*," Nuclear Instruments and Methods in Physics Research, Amsterdam, Elsevier Science Publishers B.V., pp. 219–223 (1985).

International Search Report for PCT/CA01/01706 (2 pages).

Tillmann, et al. "Processing of 200 and 300 nm Wafers in an Advanced Rapid Thermal Processing System," Proc RTP 1998, 6th International Conference on Advanced Thermal Processing of Semiconductors, Kyoto, Japan, 1998, pp. 62–63.

Lord, H.A., "Thermal and Stress Analysis of Semiconductor Wafers in a Rapid Thermal Processing Oven", (Aug. 1988), vol. 1, No. 3, IEEE Transactions on Semiconductor Manufacturing, p. 105–114.

Hill, C., et al., "Rapid Thermal Annealing—Theory and Practice", in Reduced Thermal Processing for VLSI, (New York: Plenum, 1989), p. 143–180.

Kakoschke, R., "Is There a Way to a Perfect Rapid Thermal Processing System?", (1991), vol. 224, Mat. Res. Soc. Symp. Proc., p. 159–170.

Kakoschke, R., et al., "Simulation of Temperature Effects During Rapid Thermal Processing", (1989), vol. 146, Mat. Res. Soc. Symp. Proc., p. 473–482.

Vandenabeele, P., et al., "Impact of Patterned Layers on Temperature Non–Uniformity During Rapid Thermal Processing for VLSI–Applications", (1989), vol. 146, Mat. Res. Soc. Symp. Proc., p. 149–160.

Nulman, J., et al., "Pyrometric Emissivity Measurements and Compensation in an RTP Chamber", (1989), vol. 146, Mat. Res. Soc. Symp. Proc., p. 461–466.

Dilhac, J–M., et al., "Adaptive Process Control for a Rapid Thermal Processor", (1990), SPIE vol. 1393, Rapid Thermal and Related Processing Techniques, p. 395–403.

Dilhac, J–M., "Thermal Model for Rapid Thermal Processors: Theory and Applications", (1993), RTP '93 conference proceedings, p. 12–18.

Wilson, S.R., et al., "An Overview and Comparison of Rapid Thermal Processing Equipment: A Users Viewpoint", (1986), vol. 52, Mat. Res. Soc. Symp. Proc., p. 181–190.

Blake, Julian, et al., "Slip Free Rapid Thermal Processing", (1987), vol. 92, Mat. Res. Soc. Symp. Proc., p. 265–272.

Celler, G.K., et al., "Drift of Arsenic in $SiO_2$, in a Lamp Furnace with a Built–in Temperature Gradient", (1987), vol. 92, Mat. Res. Soc. Symp. Proc., p. 53–58.

\* cited by examiner

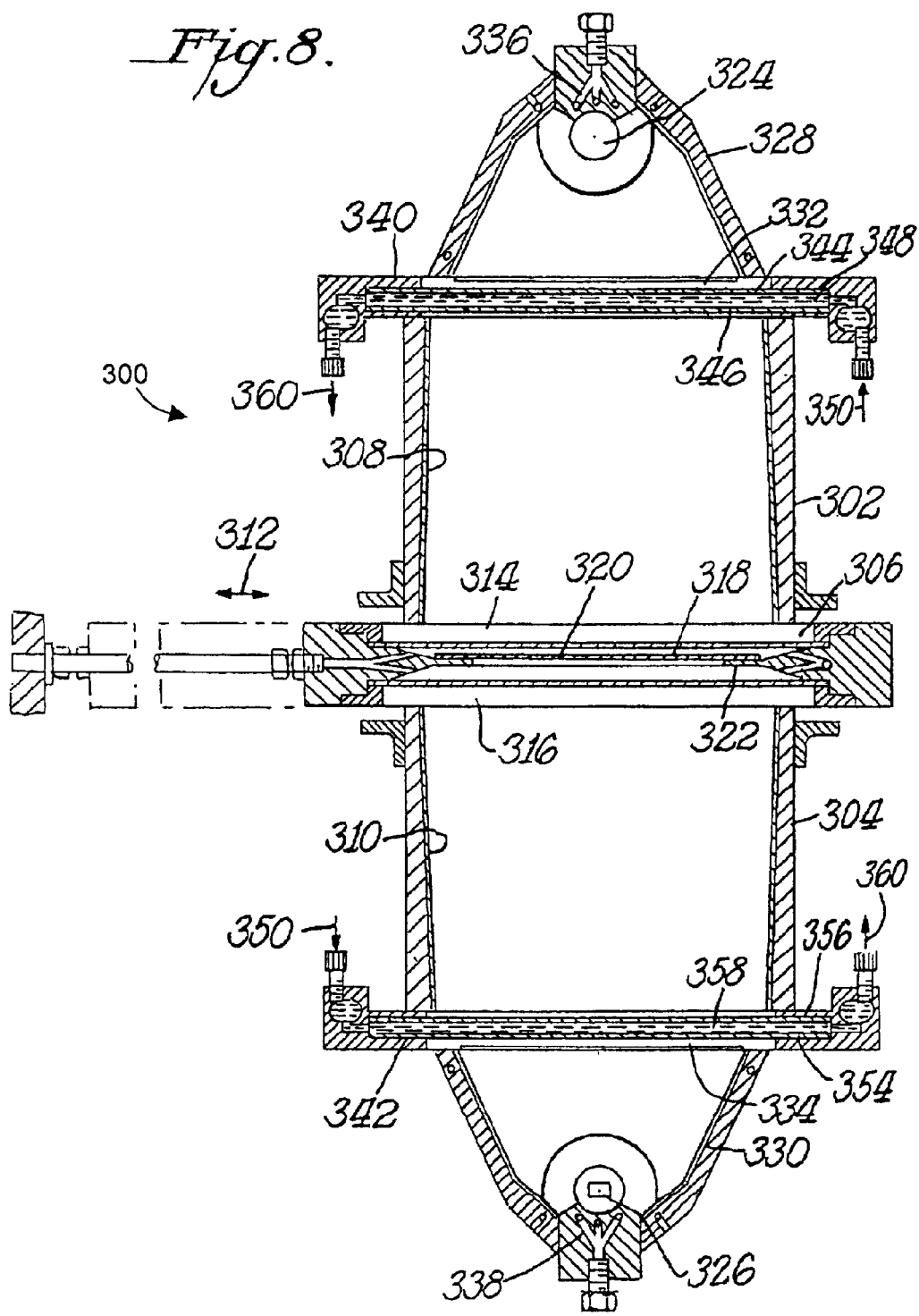

HEAT-TREATING METHODS AND SYSTEMS

CROSS-REFERENCE TO RELATED APPLICATIONS

This application is a continuation-in-part of U.S. patent application Ser. No. 09/729,747, filed Dec. 4, 2000, which is hereby incorporated herein by reference. This application further claims priority from Patent Cooperation Treaty application serial number PCT/CA01/00776, filed May 30, 2001, also incorporated herein by reference.

FIELD OF THE INVENTION

The present invention relates to heating of objects, and more particularly to methods and systems for heat-treating a workpiece.

BACKGROUND OF THE INVENTION

Many applications require heating or annealing of an object or workpiece. For example, in the manufacture of semiconductor chips such as microprocessors, a semiconductor wafer, such as a silicon wafer, is subjected to an ion implantation process, which introduces impurity atoms or dopants into a surface region of a device side of the wafer. The ion implantation process damages the crystal lattice structure of the surface region of the wafer, and leaves the implanted dopant atoms in interstitial sites where they are electrically inactive. In order to move the dopant atoms into substitutional sites in the lattice to render them electrically active, and to repair the damage to the crystal lattice structure that occurs during ion implantation, it is necessary to anneal the surface region of the device side of the wafer by heating it to a high temperature.

Heating of a semiconductor wafer may be achieved by a number of distinct types of methods, including the following:

(a) Adiabatic—where the energy is provided by a pulse energy source (such as a laser, ion beam, electron beam) for a very short duration such as 10 to 100 nanoseconds, for example. This high intensity, short duration energy melts the surface of the semiconductor to a depth of about one to two microns.

(b) Thermal flux—where energy is provided for a longer duration, such as two microseconds to five milliseconds. Thermal flux heating creates a substantial temperature gradient extending much more than two microns below the surface of the wafer, but does not cause anything approaching uniform heating throughout the thickness of the wafer.

(c) Isothermal—where energy is applied for much longer duration, such as 1 to 100 seconds for example, so as to cause the temperature of the wafer to be substantially uniform throughout its thickness at any given region.

The high temperatures required to anneal the device side of a semiconductor wafer tend to produce undesirable effects using existing technologies. For example, diffusion of the dopant atoms deeper into the silicon wafer tends to occur at much higher rates at high temperatures, with most of the diffusion occurring within close proximity to the high annealing temperature required to activate the dopants. As performance demands of semiconductor wafers increase and device sizes decrease, it is necessary to produce increasingly shallow and abruptly defined junctions, and therefore, diffusion depths that would have been considered negligible in the past or that are tolerable today will no longer be tolerable in the next few years or thereafter. Current industry roadmaps, such as the International Technology Roadmap for Semiconductors 1999 Edition (publicly available at http://public.itrs.net/) indicate that doping and annealing technologies will have to produce junction depths as shallow as 30 nm by 2005, and as shallow as 20 nm by 2008.

Existing annealing technologies are generally incapable of achieving such shallow junction depths. For example, one existing rapid thermal annealing method involves illuminating the device side of the wafer with an array of tungsten filament lamps in a reflective chamber, to heat the wafer at a high rate. However, the wafer tends to remain hot for a considerable time after the power supply to the tungsten filaments is shut off, for a number of reasons. Typical tungsten lamps have a relatively long time constant, such as 0.3 seconds, for example, as a result of the high thermal masses of the filaments, which remain hot and continue to irradiate the wafer after the power supply to the filaments is discontinued. This slow time response of the filaments gives rise to the dominant thermal lag in such a system. Also, radiation return from the walls of the reflective process chamber provides another source of continued heating after the power is shut off. A temperature versus time profile of the wafer using this tungsten lamp annealing method tends to have a rounded top with relatively slow cooling after the power to the filaments is discontinued. Accordingly, if the wafer is heated with such a system to a sufficiently high temperature to repair the crystal lattice structure and activate the dopants, the wafer tends to remain too hot for too long a period of time, resulting in diffusion of the dopants to significantly greater depths in the wafer than the maximum tolerable diffusion depths that will be required to produce 30 nm junction depths.

Although the vast majority of dopant diffusion occurs in the highest temperature range of the annealing cycle, lowering the annealing temperature is not a satisfactory solution to the diffusion problem, as lower annealing temperatures result in significantly less activation of the dopants and therefore higher sheet resistance of the wafer, which would exceed current and/or future tolerable sheet resistance limits for advanced processing devices.

One annealing method that has achieved some success in producing shallow junctions involves the use of lasers to heat and anneal the device side of the wafer. The short-wavelength monochromatic radiation produced by lasers, such as excimer lasers for example, tends to be absorbed at very shallow depths in the device side of the wafer, and the short duration, high-power laser pulse (for example, a 10 nanosecond pulse delivering about 0.4 J/cm$^2$ to the device side surface) typically used for this process tends to heat a small localized area of the surface of the device side to melting or near-melting temperatures very rapidly, in significantly less than the time required for significant thermal conduction in the wafer. Accordingly, the bulk regions of the wafer substrate tend to remain cold and therefore act as a heat sink for the heated surface region, causing the surface region to cool very quickly. A typical surface temperature versus time profile of the localized area of the device side surface using laser annealing tends to be triangular-shaped and steeply sloped for both the heating and cooling stages and therefore, the device side spends only a very short period of time at high temperatures. Thus, the wafer does not remain hot long enough for much dopant diffusion to occur. However, because the bulk regions of the wafer, as well as device side areas other than the localized area heated by the laser, remain cold when the localized surface area of the device side is heated to annealing temperature, extreme thermal gradients are produced in the wafer, resulting in large mechanical strains which cause the crystal planes within the wafer to slip, thereby damaging or breaking the crystal lattice. In this regard, a very small spatial movement may completely destroy the crystal lattice. Thermal gradients may also cause other damage, such as warpage or defect generation.

Even in the absence of slippage, a non-uniform temperature distribution across the wafer may cause non-uniform performance-related characteristics, resulting in either inadequate performance of the particular wafer, or undesirable performance differences from wafer to wafer. In addition, the large amount of energy delivered by the laser or lasers to the device side of the wafer is non-uniformly absorbed by the pattern of devices thereon, resulting in deleterious heating effects in regions of the wafer where annealing is not desired, and may also produce further large temperature gradients causing additional damage to the silicon lattice.

Other ultra-fast adiabatic heating methods similar to laser annealing have also been attempted. For example, flash lamps and microwave pulse generators have been used to rapidly heat the device side of the wafer to annealing temperature, resulting in a temperature-time profile similar to that achieved by laser annealing, with similar disadvantages.

At least one approach in the early 1990s involved a low-temperature annealing stage followed by a laser annealing stage. The low-temperature stage typically involved heating the wafer to a mid-range temperature in an electric furnace, such as 600° C. for example, for a relatively long period of time, such as an hour or longer. A typical temperature-time profile of the device side surface using this method is flat for a very long time, followed by a rapid increase and rapid cooling of the surface resulting from the laser anneal. Although this method purports to reduce junction leakage currents as compared to laser annealing alone, the long duration of the low-temperature annealing stage causes the dopants to diffuse to greater depths within the device side of the wafer. Such diffusion, which may have been tolerable or perhaps even negligible by early 1990s standards, would not permit the formation of sufficiently shallow junctions to comply with current performance and industry roadmap requirements.

A more recent approach involves the use of a fast responding argon plasma arc lamp heat source to irradiate the substrate side of the wafer, to rapidly heat the entire wafer to annealing temperatures. The time response of the arc lamp is short (typically on the order of 0.1 milliseconds or less) compared to that of the wafer itself, and thus the dominant thermal lag is that of the wafer, in contrast with the tungsten lamp method above, where the dominant thermal lag is that of the tungsten filaments. A typical temperature-time profile of the wafer using this method tends to have heating and cooling temperature rates that are intermediate between those of tungsten systems and laser annealing systems. Thus, the wafer spends less time at the high annealing temperature and therefore, less dopant diffusion occurs than with the tungsten lamp method. Accordingly, this method is capable of producing much shallower junction depths than tungsten lamp systems. As the entire wafer is heated rather than just the device side surface, the extreme transverse thermal gradients that result in laser annealing are avoided, thereby minimizing additional damage to the crystal lattice. In addition, as the substrate side is irradiated rather than the device side, non-uniform heating of the device side due to non-uniform absorption by the pattern of devices is also much lower than for laser annealing, resulting in lower lateral temperature gradients and reduced damage to devices. However, early indications suggest that embodiments of this method may result in somewhat deeper diffusion of the dopants than laser annealing.

An older approach, dating back to the 1980s, involved heating a semiconductor wafer by combining isothermal heating and thermal flux heating. The entire wafer was heated to a first intermediate temperature via isothermal heating with continuous wave lamps. Then, the front side of the wafer was heated via thermal flux using a high-power pulsed lamp array. These heating methods were carried out while the wafer and heating sources were held within an integrating light pipe or kaleidoscope with reflective inner surfaces that reflect and re-reflect radiant energy toward the wafer. Thus, as the wafer began to cool following deactivation of the lamps, radiation thermally emitted by the wafer would be reflected back to the wafer where it would be re-absorbed, thereby heating the wafer, and effectively slowing its cooling. This caused the wafer to spend longer times at high temperatures, thereby tending to increase dopant diffusion to depths that would be unacceptable by modern standards. In addition, the re-reflections of such radiation back to the wafer tended to produce non-uniform heating in the wafer, resulting in slippage and other problems associated with non-uniform or excessive heating. Moreover, this method purported to be suitable for heating the wafer with 2% uniformity, which is not acceptable for modern RTP systems. In addition, this method typically involved a delay of a few seconds between the isothermal heating stage and the subsequent thermal flux heating stage, during which the wafer remained at a relatively high intermediate temperature, such as 1100° C., for example. This delay at the intermediate temperature can cause significant dopant diffusion, thus interfering with the ability to produce shallow junctions in accordance with modern performance requirements.

Accordingly, there is a need for improved methods and systems for heat-treating a workpiece, such as a semiconductor wafer. In addition to annealing a semiconductor wafer for ion activation and lattice repair purposes, other applications may also benefit from an improved heat-treating method that addresses the above problems.

SUMMARY OF THE INVENTION

The present invention addresses the above needs by providing, in accordance with one aspect of the invention, a method and system for heat-treating a workpiece. The method includes pre-heating the workpiece to an intermediate temperature, heating a surface of the workpiece to a desired temperature greater than the intermediate temperature, and enhancing cooling of the workpiece. Pre-heating the workpiece to the intermediate temperature, prior to heating the surface to the higher desired temperature, decreases the magnitude of the thermal gradients that occur in the workpiece when the surface is heated to the desired temperature. Therefore, thermal stress in the workpiece is reduced. Where the workpiece has a crystal lattice structure, such as a semiconductor wafer for example, damage to the lattice is correspondingly reduced.

In addition, heating the surface of the workpiece to the desired temperature, as opposed to heating the entire workpiece to the desired temperature, results in much faster cooling of the surface, as the comparatively colder bulk or body of the workpiece may act as a heat sink to cool the surface by conduction. Where the workpiece is a dopant-implanted semiconductor wafer for example, this faster cooling results in shallower dopant diffusion, allowing for the formation of shallower junctions in accordance with modern and future industry requirements.

Enhancing cooling of the workpiece further reduces the time that the workpiece spends at high temperatures. In embodiments where the workpiece is a semiconductor wafer, this faster cooling again reduces dopant diffusion in the workpiece, allowing for the formation of shallower junctions.

Enhancing cooling preferably includes absorbing radiation thermally emitted by the workpiece. Thus, radiation thermally emitted by the workpiece is absorbed, rather than being reflected back to the workpiece to effectively re-heat it.

Absorbing may include absorbing the radiation at a radiation absorbing surface. Such a surface may include a wall of a radiation absorbing chamber, for example.

Alternatively, or in addition, absorbing may include absorbing the radiation thermally emitted by the workpiece at a selective-filtering system. If so, then pre-heating the workpiece may involve transmitting radiation produced by an irradiance source through a filtering device of the selective-filtering system to the workpiece. Transmitting may involve transmitting the radiation to a second surface of the workpiece.

Similarly, heating the surface of the workpiece may include transmitting radiation produced by an irradiance source through a filtering device of the selective-filtering system to the surface of the workpiece.

The method may further include cooling the selective-filtering system. This may be achieved by causing a liquid to flow across a surface of a window of the selective-filtering system, for example. More particularly, this may include causing a liquid to flow in a space defined between first and second spaced apart windows of the selective-filtering system.

Heating the surface may include rapidly heating the surface to the desired temperature by activating a source of thermal flux or adiabatic energy. The method may further include deactivating the source of thermal flux or adiabatic energy.

Pre-heating the workpiece to the intermediate temperature may include pre-heating the workpiece to a temperature in the range of 600° C. to 1250° C. Heating the surface of the workpiece to the desired temperature may include heating the surface to a temperature in the range of 1050° C. to 1430° C. These temperatures may be particularly advantageous in embodiments where the workpiece is a silicon semiconductor wafer, for example, as the upper end of the desired temperature range corresponds roughly to the melting point of silicon. These temperature ranges may vary for semiconductor wafers made from materials other than silicon.

Pre-heating the workpiece preferably includes pre-heating the workpiece for a time period greater than a thermal conduction time of the workpiece. This serves to allow much of the energy supplied to the workpiece during the pre-heating stage to conduct through the workpiece, thereby raising substantially the entire bulk of the workpiece to the intermediate temperature.

Conversely, heating preferably involves heating the surface for a time period less than a thermal conduction time of the workpiece. Thus, the surface may be heated quickly to the desired temperature while the bulk of the workpiece remains substantially at the cooler intermediate temperature. This allows the bulk of the workpiece to act as a heat sink for the heated surface, causing the surface to cool much more rapidly when the heating stage is completed. As dopant diffusion occurs more significantly at the highest temperature range, i.e. between the intermediate temperature and the desired temperature, this approach minimizes the time spent by the surface in this highest temperature range, thereby minimizing dopant diffusion.

Heating the surface of the workpiece may include commencing the heating substantially immediately when the workpiece reaches the intermediate temperature. For example, this may include commencing the heating of the surface within an interval following the arrival of the workpiece at the intermediate temperature, the interval having a duration less than or equal to a thermal conduction time of the workpiece. This avoids any substantial delay at the intermediate temperature, which, in embodiments where the workpiece is a semiconductor wafer, avoids any corresponding increase in dopant diffusion that would otherwise result from such a delay.

Pre-heating may include pre-heating the workpiece at a rate of at least 100° C. per second, preferably at a rate of at least 400° C. per second. Pre-heating may include irradiating the workpiece with electromagnetic radiation produced by an arc lamp. If desired, more than one such arc lamp may be employed, such as an array of arc lamps, for example.

Heating may include irradiating the workpiece with electromagnetic radiation produced by a flash lamp. This may include a plurality of such flash lamps, if desired.

In embodiments where the workpiece is a semiconductor wafer, the heating is preferably carried out at a rate of at least 10,000° C. per second, or even more preferably at a rate of at least 100,000° C. per second. The heating is preferably achieved by irradiating the workpiece with electromagnetic radiation produced by an arc lamp or a flash lamp. This may include use of an array of such lamps. Alternatively, other heating devices, such as a laser, may be substituted if desired.

Enhancing cooling of the workpiece preferably includes allowing the workpiece to cool at a rate of at least about 100° C. per second, preferably at a rate of at least 150 to 180° C. per second.

In accordance with another aspect of the invention, there is provided a system for heat-treating a workpiece. The system includes a pre-heating device operable to pre-heat the workpiece to an intermediate temperature, a heating device operable to heat a surface of the workpiece to a desired temperature greater than the intermediate temperature, and a cooling enhancement system for enhancing cooling of the workpiece to a temperature below the intermediate temperature.

The cooling enhancement system preferably includes an absorption system operable to absorb radiation thermally emitted by the workpiece.

The absorption system may include a radiation absorbing surface. The radiation absorbing surface may include a wall of a radiation absorbing chamber.

The absorption system may include a selective-filtering system. If so, the selective-filtering system may include a filtering device interposed between the pre-heating device and the workpiece and configured to transmit radiation produced by the pre-heating device to the workpiece. In this regard, the filtering device may be configured to transmit the radiation to a second surface of the workpiece.

Similarly, the selective-filtering system may include a filtering device interposed between the heating device and the workpiece and configured to transmit radiation produced by the heating device to the surface of the workpiece.

The system may further include a cooling subsystem for cooling the selective-filtering system.

The selective-filtering system may include at least one window, and the cooling subsystem may include a liquid-cooling subsystem for causing a liquid to flow across a surface of the window.

The selective-filtering system may include first and second spaced apart windows, and the cooling subsystem may include a liquid-cooling subsystem for causing a liquid to flow in a space defined between the windows.

The heating device may include a source of thermal flux or adiabatic energy operable to rapidly heat the surface to the desired temperature.

The pre-heating device may be operable to pre-heat the workpiece to a temperature in the range of 600° C. to 1250° C., and similarly, the heating device may be operable to heat the surface to a temperature in the range of 1050° C. to 1430° C.

The pre-heating device is preferably operable to pre-heat the workpiece for a time period greater than a thermal conduction time of the workpiece.

Conversely, the heating device is preferably operable to heat the surface of the workpiece for a time period less than a thermal conduction time of the workpiece. The heating device is preferably operable to commence heating the surface substantially immediately when the workpiece reaches the intermediate temperature.

The pre-heating device may be operable to pre-heat the workpiece at a rate of at least 100° C. per second. The pre-heating device may include an arc lamp operable to irradiate the workpiece with electromagnetic radiation.

The heating device may include a flash lamp operable to irradiate the workpiece with electromagnetic radiation.

The cooling enhancement system preferably allows the workpiece to cool at a rate of at least about 100° C. per second.

In accordance with another aspect of the invention, there is provided a system for heat-treating a workpiece. The system includes means for pre-heating the workpiece to an intermediate temperature, means for heating a surface of the workpiece to a desired temperature greater than the intermediate temperature, and means for enhancing cooling of the workpiece. The means for enhancing preferably includes means for absorbing radiation thermally emitted by the workpiece.

In accordance with another aspect of the invention, there is provided a selective-filtering system for use in heat-treating a workpiece. The system includes a first filtering device configured to transmit radiation from a pre-heating device to the workpiece to pre-heat the workpiece to an intermediate temperature, and configured to absorb radiation thermally emitted by the workpiece. The system further includes a second filtering device configured to transmit radiation from a heating device to a surface of the workpiece to heat the surface to a desired temperature greater than the intermediate temperature, and configured to absorb radiation thermally emitted by the workpiece.

The system may further include a cooling subsystem for cooling the first and second filtering devices.

If desired, at least one of the first and second filtering devices may include a liquid-cooled window. The liquid-cooled window may include a water-cooled quartz window.

In accordance with another aspect of the invention, there is provided a method of heat-treating a workpiece. The method includes pre-heating the workpiece to an intermediate temperature, and heating a surface of the workpiece to a desired temperature greater than the intermediate temperature, the heating commencing substantially immediately when the workpiece reaches the intermediate temperature. Commencing the surface heating substantially immediately when the workpiece reaches the intermediate temperature avoids any delay at the intermediate temperature, which, in embodiments where the workpiece is a semiconductor wafer, avoids any corresponding increase in dopant diffusion that would otherwise result from such a delay.

Heating the surface preferably includes commencing the heating within less than one second after the workpiece reaches the intermediate temperature. This preferably includes commencing the heating within less than one-quarter second after the workpiece reaches the intermediate temperature. More preferably still, this may include commencing the heating within less than $1 \times 10^2$ milliseconds after the workpiece reaches the intermediate temperature. This may include commencing the heating within less than $1 \times 10^1$ milliseconds after the workpiece reaches the intermediate temperature.

Pre-heating preferably includes pre-heating the workpiece for a time period greater than a thermal conduction time of the workpiece. Conversely, heating preferably includes heating the surface for a time period less than a thermal conduction time of the workpiece.

Heating may include commencing the heating in response to an indication that the temperature of the workpiece is at least the intermediate temperature. The method may further include producing the indication.

Pre-heating preferably includes irradiating the workpiece. This may include exposing the workpiece to electromagnetic radiation produced by an arc lamp. Alternatively, or in addition, this may include exposing the workpiece to electromagnetic radiation produced by at least one filament lamp.

Pre-heating preferably includes pre-heating the workpiece at a rate of at least 100° C. per second. This may include pre-heating the workpiece at a rate of at least 400° C. per second.

Heating the surface of the workpiece preferably includes irradiating the surface. This may include exposing the surface to electromagnetic radiation produced by a flash lamp. Alternatively, this may include moving a laser beam across the surface.

The method may further include absorbing radiation reflected and thermally emitted by the workpiece. Absorbing may include absorbing the radiation in a radiation absorbing environment. This may include absorbing the radiation in at least one radiation absorbing surface.

The method may further include cooling the at least one radiation absorbing surface.

In accordance with another aspect of the invention, there is provided a system for heat-treating a workpiece. The system includes a pre-heating device operable to pre-heat the workpiece to an intermediate temperature, and a heating device operable to heat a surface of the workpiece to a desired temperature greater than the intermediate temperature, and operable to commence the heating of the surface substantially immediately when the workpiece reaches the intermediate temperature.

The heating device and the pre-heating device may be operable to carry out the various methods described above and elsewhere herein.

The system may further include a temperature indicator operable to produce an indication of a temperature of the workpiece, in which case the heating device may be operable to commence the heating in response to an indication from the temperature indicator that the temperature of the workpiece is at least the intermediate temperature.

The pre-heating device may include means for irradiating the workpiece. The pre-heating device may include an irradiance source operable to irradiate the workpiece. The irradiance source may includes an arc lamp. Or, the irradiance source may include at least one filament lamp. Alternatively, the pre-heating device may include a hot body locatable to pre-heat the workpiece.

The heating device may include means for irradiating the surface. The heating device may include an irradiance source operable to irradiate the surface. The irradiance source may include a flash lamp. Alternatively, the irradiance source may include a laser.

The system may further include a radiation absorbing environment operable to absorb radiation reflected and thermally emitted by the workpiece. Similarly, the system may further include at least one radiation absorbing surface operable to absorb radiation reflected and thermally emitted by the workpiece. The system may further include a cooling subsystem operable to cool the at least one radiation absorbing surface.

In accordance with another aspect of the invention, there is provided a system for heat-treating a workpiece. The system includes means for pre-heating the workpiece to an intermediate temperature, and means for heating a surface of the workpiece to a desired temperature greater than the intermediate temperature, including means for commencing the heating substantially immediately when the workpiece reaches the intermediate temperature.

In accordance with another aspect of the invention, there is provided a semiconductor heating apparatus. The apparatus includes a first heating source for heating a first surface of a semiconductor wafer, and a second heating source for heating a second surface of the semiconductor wafer. The apparatus further includes a first cooled window disposed between the first heating source and the semiconductor wafer.

The first cooled window may include a first optically transparent plate cooled by a cooling fluid. The first cooled window may further include a second optically transparent plate separated from the first optically transparent plate to define a passageway through which the cooling fluid may flow.

The cooling fluid may include water.

The first optically transparent plate may be formed from quartz, as may be the second optically transparent plate.

The semiconductor heating apparatus may further include a second cooled window disposed between the second heating source and the semiconductor wafer.

The first cooled window preferably absorbs radiation thermally emitted by the semiconductor wafer. In this regard, the first cooled window preferably absorbs radiation to controllably cool the semiconductor wafer at a rate of at least 100° C. per second.

The second cooled window may absorb radiation to controllably cool the semiconductor wafer at a rate of at least 100° C. per second.

The first heating source may include an arc lamp. This may include an array of arc lamps if desired. Similarly, the second heating source may include an arc lamp, which may include an array of arc lamps if desired.

Or, the first heating source may include a tungsten lamp or array of tungsten lamps.

The semiconductor heating apparatus may further include a chamber housing the semiconductor wafer, wherein the chamber has one or more walls with a radiation-absorbing surface.

Alternatively, the apparatus may include a chamber housing the semiconductor wafer, wherein the chamber has one or more walls with a radiation-reflecting surface. If so, the chamber walls may be inwardly tapered at an angle from 2 to 6 degrees from perpendicular.

If desired, the enhanced cooling of the bulk of the workpiece may be carried out by absorbing radiation reflected by or thermally emitted by the workpiece. In one exemplary embodiment, the workpiece is isolated from a heating source by a cooled window and radiation thermally emitted by the workpiece is absorbed by the cooled window. In another embodiment, the workpiece is held within a radiation absorbing chamber and radiation reflected by or thermally emitted by the workpiece is absorbed by one or more walls of the chamber. Further embodiments combine one or more such cooled windows with such a radiation absorbing chamber.

If a cooled window is used, the cooled window may include a first optically transparent plate that is cooled by flow of a cooling fluid. The cooled window may further include a second optically transparent plate spaced apart from the first optically transparent plate to define at least one channel between the first and second optically transparent plates, and the cooling fluid may be pumped through that channel. The optically transparent plates may be formed from a material generally transparent to the radiant energy emitted by the radiant sources used to heat the workpiece. One such optically transparent material to form the optically transparent plate is quartz, although sapphire, glass or other materials may be substitutable depending upon the heating devices used. The cooling fluid may include a liquid, such as water. In one embodiment, the cooled window absorbs radiation with wavelengths of about 1.4 $\mu$m and above, which are the radiant wavelengths where most of the radiation is expected to be emitted by a workpiece such as a silicon semiconductor wafer.

A semiconductor heating apparatus according to one embodiment of the invention includes a first heating source for heating a first surface of the semiconductor wafer, and a second heating source for heating a second surface of the semiconductor wafer, with a first cooled window disposed between the first heating source and the semiconductor wafer; and a second cooled window disposed between the second heating source and the semiconductor wafer. The cooled windows isolate the heating sources from the semiconductor wafer to prevent contamination. In addition, the cooled windows act to controllably cool the wafer by absorbing radiation thermally emitted by or reflected by the wafer. Preferably, the cooled windows absorb radiation at a rate high enough to achieve a cooling rate of 150 to 180° C. per second to controllably cool the semiconductor wafer.

Preferably, the first cooled window includes a first optically transparent plate cooled by a cooling fluid. Most preferably, the first cooled window further includes a second optically transparent plate separated from the first optically transparent plate to define at least one passageway or channel through which the cooling fluid may flow. The preferred cooling fluid is a liquid such as water. The preferred material for forming the optically transparent plates is quartz.

In some exemplary embodiments the first and second heating sources are arc lamps or arrays of arc lamps. Either one of the first and second heating sources may also be a tungsten lamp or array of tungsten lamps.

One embodiment has one or more chambers for housing the semiconductor wafer during heat-treating, wherein the chambers have sidewalls with radiation reflecting surfaces. However, the semiconductor heating apparatus may further include a chamber for housing the semiconductor wafer, wherein the chamber has one or more sidewalls with radiation-absorbing surfaces. The radiation-absorbing surfaces further assist in controllably cooling the semiconductor wafer.

In embodiments where the workpiece is a semiconductor wafer for example, pre-heating the workpiece may include irradiating a substrate side of the wafer, and heating the surface of the workpiece may include irradiating a device side of the wafer. Due to the greater uniformity of the emissivity across the substrate side of the wafer as compared to the device side, the irradiation of the substrate side to pre-heat the wafer results in significantly greater temperature uniformity in the wafer, and therefore significantly less thermal stress damage, than other methods that deliver the entire annealing energy to the device side of the wafer. In contrast, if the device side alone was irradiated to heat the device side from room temperature to 1050° C. for example, then an emissivity difference of 10% between different devices on the device side may result in a lateral temperature difference of approximately 100° C., which is well in excess of current tolerable temperature difference limits, and may therefore cause thermal stress damage to the devices and to the lattice.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention,

FIG. 2A is a cross-sectional view in side elevation of a heating device and a filtering device of the heat-treating system shown in FIG. 2;

FIG. 6A is a cross-sectional view in side elevation of a heating device and a filtering device of the heat-treating system shown in FIG. 6;

FIG. 7A is a cross-sectional view in side elevation of a heating device and a filtering device of the heat-treating system shown in FIG. 7; and FIG. 8 is a schematic side view of a system for heat-treating a workpiece according to a sixth embodiment of the invention (shown with a side wall removed).

DETAILED DESCRIPTION

Figure 1:
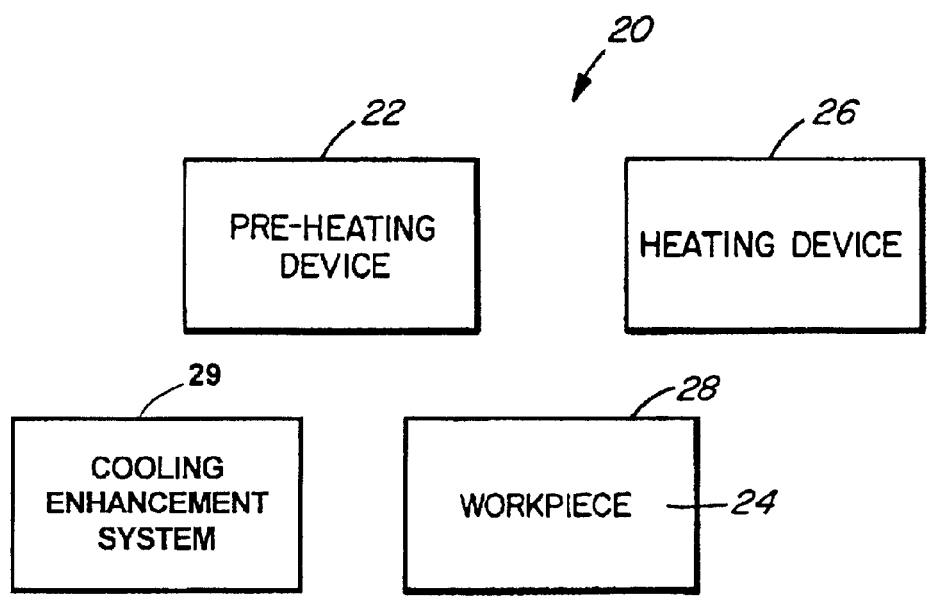
FIG. 1 is a block diagram of a system for heat-treating a workpiece according to a first embodiment of the invention.

Referring to FIG. 1, a system for heat-treating a workpiece according to a first embodiment of the invention is shown generally at 20. The system includes a pre-heating device 22 operable to pre-heat the workpiece 24 to an intermediate temperature, and a heating device 26 operable to heat a surface 28 of the workpiece to a desired temperature greater than the intermediate temperature. The system further includes a cooling enhancement system 29 for enhancing cooling of the workpiece to a temperature below the intermediate temperature.

System

Figure 2:
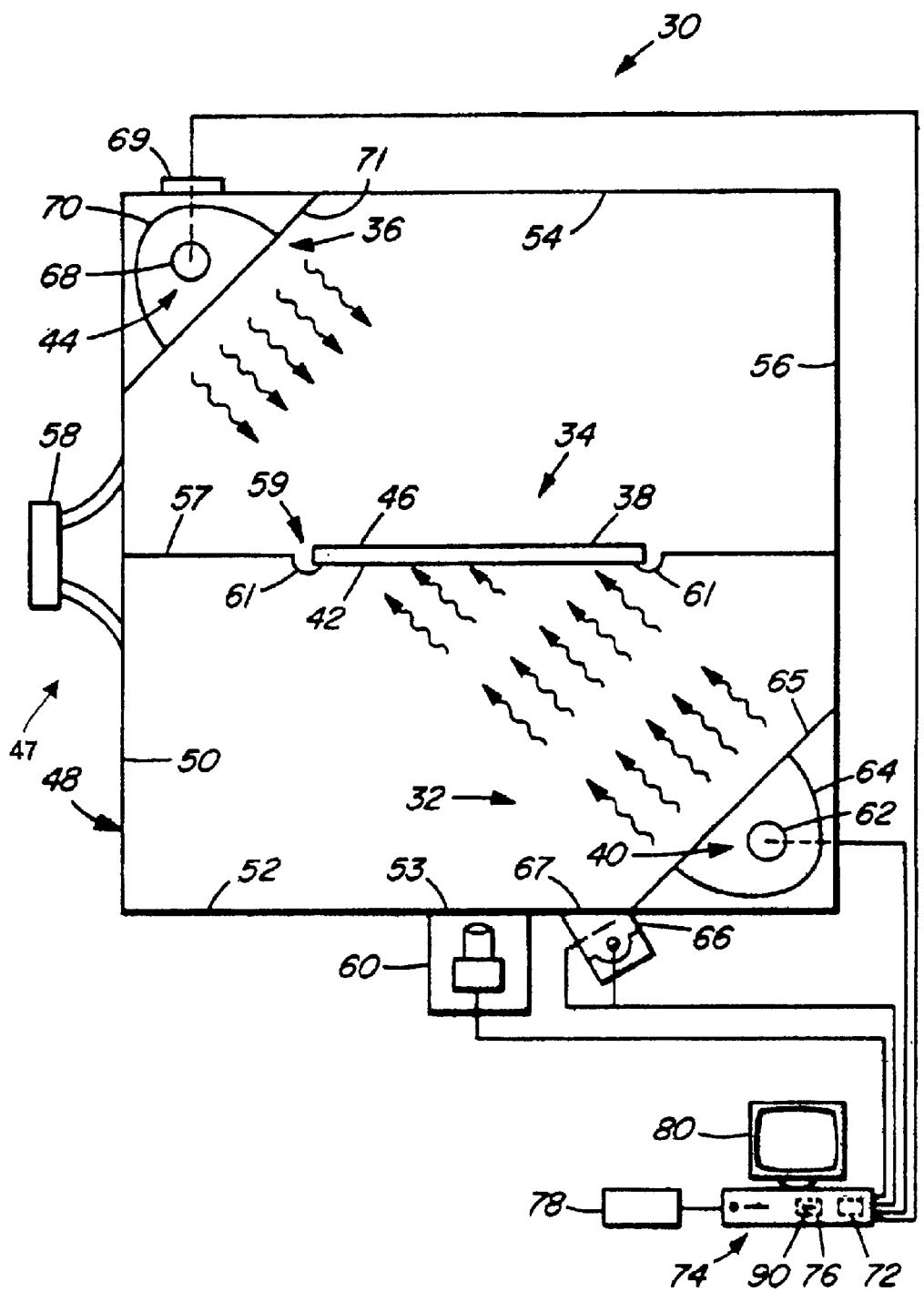
FIG. 2 is a schematic side view of a system for heat-treating a workpiece according to a second embodiment of the invention (shown with a side wall removed)

Referring to FIG. 2, a system for heat-treating a workpiece according to a second embodiment of the invention is shown generally at 30. The system 30 includes a pre-heating device 32, operable to pre-heat a workpiece 34, which in this embodiment is a semiconductor wafer, to an intermediate temperature. The system further includes a heating device 36, which in this embodiment is operable to heat a surface 38 of the workpiece 34 to desired temperature greater than the intermediate temperature.

In this embodiment, the pre-heating device 32 is operable to pre-heat the workpiece 34 from an initial temperature to the intermediate temperature, and the heating device 36 is operable to heat the surface 38 of the workpiece 34 to the desired temperature, which is greater than the intermediate temperature by an amount less than or equal to about the difference between the intermediate and initial temperatures. In other words, a significant portion of the heating occurs during the heating from the initial temperature to the intermediate temperature. In this embodiment, the heating device is operable to commence the heating within less time following the first time period than the first time period. More particularly, in this embodiment the heating device is operable to commence the heating of the surface substantially immediately when the workpiece reaches the intermediate temperature.

Also in this embodiment, the pre-heating device 32 includes a first irradiance source 40 operable to irradiate a first side 42 of the workpiece 34 to pre-heat the workpiece 34 to the intermediate temperature. The heating device 36 includes a second irradiance source 44 operable to irradiate a second side 46 of the workpiece 34, which in this embodiment is co-extensive with the surface 38 of the workpiece 34, to heat the second side 46 to the desired temperature greater than the intermediate temperature. Note, however, that in an alternative embodiment, the heating device 36 also may be activated while the pre-heating device 32 is activated for pre-heating the workpiece. Thus, if desired, the pre-heating may be achieved by using both the heating device 36 and the pre-heating device 32.

As the workpiece 34 in the present embodiment is a semiconductor wafer, the heat-treating system 30 effectively acts as a semiconductor heating apparatus.

Process Chamber

Still referring to FIG. 2, in this embodiment, the system 30 includes a cooling enhancement system shown generally at 47 for enhancing cooling of the workpiece to a temperature below the intermediate temperature. In this embodiment, the cooling enhancement system 47 includes an absorption system operable to absorb radiation thermally emitted by the workpiece. More particularly, in this embodiment the absorption system includes a radiation absorbing environment operable to absorb radiation reflected and thermally emitted by the workpiece 34. More particularly still, in this embodiment the radiation absorbing environment is provided by a radiation absorbing chamber 48 surrounding the workpiece 34. The radiation absorbing chamber 48 includes walls 50, 52, 54 and 56, each of which acts as a radiation absorbing surface operable to absorb the radiation reflected and thermally emitted by the workpiece 34. Thus, in this embodiment, the absorption system of the cooling enhancement system 47 includes a radiation absorbing surface, which in turn includes a wall of a radiation absorbing chamber.

In this embodiment the walls 50, 52, 54 and 56 are made of black stainless steel. Alternatively, other suitable radiation-absorbing materials may be used, such as anodized aluminum, for example. As a further alternative, the walls may be composed of virtually any thermally conductive material and coated with a radiation-absorbing substance, such as paint containing graphite, for example.

In this embodiment, the absorption system of the cooling enhancement system 47 further includes a selective-filtering system, discussed in greater detail below.

Generally, the radiation-absorbing effect of the cooling enhancement system 47, or more particularly of the radiation absorbing chamber 48, serves to increase the response time of the system 30, so that the workpiece 34 begins to cool more quickly after the pre-heating and heating devices 32 and 36 are switched off than it would if a reflective chamber were substituted for the radiation absorbing chamber 48. This increased system response time results in a more sharply-defined temperature profile in which the surface 38 of the workpiece 34 spends less time at the highest temperatures involved in any given thermal cycle. Where the workpiece 34 is an ion-implanted semiconductor wafer, this tends to reduce the dopant diffusion depth during the thermal cycle, allowing for the formation of shallower junctions. In addition, using the radiation absorbing chamber 48 reduces possible damage to the crystal lattice of such a workpiece, as compared to systems using reflective chambers, which non-uniformly reflect radiation back to the workpiece which then non-uniformly absorbs such radiation, giving rise to increased thermal gradients and thermal stress in the workpiece. The cooling enhancement system 47 not only improves the uniformity of the heating of the workpiece by removing any such re-reflections during the heating stages, but additionally, during the cooling stages when the heating sources are deactivated, the cooling enhancement system enhances cooling of the workpiece by preventing radiation thermally emitted by the workpiece from being reflected back to the workpiece, which would tend to re-heat the workpiece. Thus, the overall rate of cooling is enhanced by the effect of the absorption system of the cooling enhancement system 47, thereby further reducing dopant diffusion in the workpiece. In this embodiment, the cooling enhancement system 47 allows the workpiece to cool at a rate of at least 100° C. per second, or more particularly, at a rate of at least 180° C. per second. Alternatively, however, a reflective chamber may be substituted for the radiation absorbing chamber 48, if desired, which would increase the energy efficiency of the thermal cycle at the expense of greater dopant diffusion and thermal stress in the workpiece.

In this embodiment, the system 30 further includes a cooling subsystem 58 operable to cool the radiation absorbing surfaces of the walls 50, 52, 54 and 56 of the radiation absorbing chamber 48. More particularly, in this embodiment the cooling subsystem 58 is a water circulation system, although alternatively other cooling enhancement systems may be substituted. Alternatively, the cooling subsystem 58 may be omitted, although this would be undesirable if radiation absorbing surfaces are such as walls 50, 52, 54 and 56 are provided, as the radiation absorbing surfaces would otherwise tend to become hot and thermally emit radiation, which would continue to heat the workpiece 34 after the pre-heating and heating devices 32 and 36 are deactivated, thereby slowing the response time of the system 30. For a similar reason, in the present embodiment, in which the cooling enhancement system 47 includes a selective-filtering system (discussed in greater detail further below) such as one or more water-cooled windows, the cooling subsystem 58 may also be used to cool the selective-filtering system. Similarly, the cooling subsystem 58 may be used to cool any other windows of the system 30, such as a window 53 discussed below, for example.

In this embodiment the system 30 further includes a temperature indicator 60 operable to produce an indication of a temperature of the workpiece. More particularly, in this embodiment the temperature indicator 60 includes a measuring system such as that disclosed in commonly-owned U.S. Pat. No. 6,303,411, issued Oct. 16, 2001, which is incorporated herein by reference. Thus, in the present embodiment the temperature indicator 60 includes a charge-coupled device (CCD) mounted beneath a quartz window 53 in the wall 52 of the radiation absorbing chamber 48, and further includes a CCD optics system (not shown) and a band-pass filter (not shown) interposed between the CCD and the window 53, and a radiation sensor (not shown) mounted on a lower surface of an internal wall 57 of the radiation absorbing chamber 48. Alternatively, other temperature indicators, such as a pyrometer for example, may be substituted for the temperature indicator. As a further alternative, the temperature of the workpiece 34 may simply be predicted from the power supplied to the workpiece, without the necessity of directly measuring the workpiece temperature.

The internal wall 57 in the radiation absorbing chamber 48 extends between the walls 50 and 56 of the radiation absorbing chamber. An annular guard ring 61 is set in a disc-shaped opening 59 in the internal wall 57 and extends radially inward into the opening 59. The guard ring 61 includes the same or similar material as the workpiece, which in this embodiment is a silicon semiconductor wafer. The guard ring is used to reduce edge effects during the thermal cycle, and acts as a locator for locating the workpiece in a desired position relative to the pre-heating and heating devices 32, 36. Alternatively, other means for supporting the workpiece may be substituted.

In addition, if desired, the radiation absorbing chamber 48 may include gas flow ports (not shown) and flow controllers (not shown) for controlling gas flows in the vicinity of the workpiece, although such elements are not necessary for typical annealing applications.

Workpiece

Still referring to FIG. 2, in this embodiment, the workpiece 34 is a semiconductor wafer. More particularly, in this embodiment the semiconductor wafer is a silicon wafer used in the manufacture of semiconductor chips, such as microprocessors and memory devices, for example. The first side 42 of the workpiece 34 is a substrate side, while the second side 46 is a device side. Thus, as shown in FIG. 2, in this embodiment, the first and second irradiance sources 40 and 44 are locatable to irradiate the substrate side and the device side, respectively, of a semiconductor wafer. The device side (the second side 46) of the silicon wafer workpiece 34 has been previously subjected to an ion implantation process, such as ultra-low energy boron implantation for the formation of shallow p+/n junctions, for example, to implant impurity or dopant atoms into surface regions of the device side. As a result of such ion implantation, the workpiece suffers crystalline lattice damage, and the boron implants tend to remain concentrated largely at interstitial locations where they are electrically inactive, in a high boron concentration layer produced by the implant in the vicinity of the second side 46. Therefore, the workpiece 34 must be subjected to an annealing process to force the implants into substitutional sites in the lattice of the silicon wafer, thereby rendering them electrically active, and to repair the crystalline lattice damage suffered during ion implantation.

Alternatively, however, embodiments of the present invention have applications beyond mere activation of implanted dopants and therefore the workpiece 34 may alternatively include a wafer that is to be annealed for different purposes. For example, other embodiments of the heat-treating methods and systems exemplified herein may be applied to anneal layers of metals, oxides, nitrides, silicides, silicates or transition metal oxides on regions of the wafer. Similarly, other embodiments may also be used to thermally oxidize or to thermally nitridize regions of the wafer, or to drive chemical vapor deposition of layers on the wafer, or to drive solid state reactions within the bulk and the near surface regions of the wafer, to name but a few examples.

More generally, it is expected that many types of workpieces that include a base material coated with a plurality of layers of differing materials may benefit from embodiments of the heat-treating methods exemplified herein. In this regard, the base material may include a semiconductor such as silicon, silicon carbide or gallium arsenide, for example, but alternatively, may include a magnetic medium used to fabricate memory media or magnetic read/write heads, or may include a glass used to fabricate flat panel displays, for example. Such workpieces may or may not have been subjected to a surface modification process such as pre-amorphization, and the layers may be either laterally continuous or discontinuous (as a result of intentional patterning) across the surfaces of the base material, or a combination of continuous and discontinuous layers.

More broadly, however, the workpiece 34 need not be any of the above types of workpieces, but may alternatively include any other type of workpiece that would benefit from the heat-treating methods and systems disclosed herein.

Pre-Heating Device

Still referring to FIG. 2, in this embodiment, the pre-heating device 32, or more particularly the first irradiance source 40, includes an arc lamp 62 operable to irradiate the workpiece 34 with electromagnetic radiation. More particularly, in this embodiment the arc lamp 62 is a 500 kW double water wall argon plasma arc lamp available from Vortek Industries Ltd. of Vancouver, British Columbia, Canada. An example of such an arc lamp is disclosed in commonly-owned Patent Cooperation Treaty application Ser. No. PCT/CA01/00051, published Jul. 26, 2001 under Publication No. WO 01/54166, which is hereby incorporated herein by reference. Such arc lamps provide numerous advantages for semiconductor annealing as compared to tungsten filament lamp sources. For example, as a result of the low thermal mass of argon plasmas, the response time of the arc lamp 62 is on the order of 0.1 or 0.2 ms or less, which is not only faster than a thermal conduction time for a silicon wafer but is also three orders of magnitude faster than response times of typical tungsten filament lamps. The arc lamp 62 thus permits a faster thermal cycle resulting in less dopant diffusion than tungsten filament annealing systems. In addition, the arc lamp 62 produces over 95% of its spectral distribution below the 1.2 $\mu$m band gap absorption of cold silicon, as compared to 40% for typical tungsten lamp sources, resulting in greater heating efficiency. Also, the plurality of tungsten filament lamps in a typical tungsten annealing system are not perfectly calibrated with one another and their irradiance spectra also change over time due to changes in the filament, accumulation of deposits on lamp bulb surfaces, etc. Therefore, the use of the single arc lamp 62, whose irradiance does not appreciably change over time, increases the uniformity of irradiation of the workpiece, resulting in lower thermal gradients in the workpiece and less corresponding thermal damage to the lattice, and eliminates the need for frequent calibration and re-calibration of a large number of energy sources, such as an array of tungsten lamps, for example. Similarly, the long lifetime of the arc lamp 62 eliminates the need for frequent replacement and re-calibration of burned-out bulbs. Alternatively, however, other types of pre-heating devices, including even tungsten filament lamp sources or arrays of such lamp sources, may be substituted.

In this embodiment the pre-heating device 32 further includes a reflector 64. The reflector 64 is formed by a series of flat segments forming a trough shape, so as to cooperate with the arc lamp 62 to produce a generally uniform irradiance field. In this embodiment, the reflector 64 includes a reflector manufactured by Vortek Industries Ltd., of Vancouver, Canada. Alternatively, the reflector 64 may be omitted or replaced with other reflectors, although it is desirable that the irradiance field be generally uniform.

The arc lamp 62 is positioned at a focal point of the reflector 64, and the arc lamp 62 and the reflector 64 are positioned to irradiate the first side 42 of the workpiece 34 with a substantially uniform irradiance field at an angle of incidence of 45 degrees relative to the surface of the first side 42 of the workpiece.

In this embodiment, the radiation absorbing chamber 48 further includes a quartz window 65 extending between the walls 52 and 56 of the radiation absorbing chamber. The quartz window 65 serves to isolate the arc lamp 62 and reflector 64 from the interior of the radiation absorbing chamber 48, to prevent contamination of the workpiece, lamp or reflector.

In the present embodiment, the pre-heating device 32 further includes a continuous power supply (not shown) for supplying power to the arc lamp 62 for continuous operation to pre-heat the workpiece. In this regard, the pre-heating device of the present embodiment is operable to pre-heat the workpiece at a rate of at least 100° C. per second, up to an intermediate temperature in the range of from 600° C. to 1250° C. More particularly, in this embodiment the ramp rate is at least 250° C. per second, or more particularly still, the rate is at least 400° C. per second. To achieve such ramp rates, the arc lamp 62 is capable of irradiating the first side 42 of the workpiece with an intensity of approximately $1 \times 10^2$ W/cm$^2$ to achieve a ramp rate moderately in excess of 250° C. per second, or an intensity of approximately $1.4 \times 10^2$ W/cm$^2$ to achieve a ramp rate moderately in excess of 400° C. per second, such radiation intensities being determined by the input power supplied to the arc lamp. Alternatively, the arc lamp is capable of accepting a continuous range of input power levels and accordingly, faster or slower ramp rates may be substituted, although slower rates tend to result in increased dopant diffusion, and much faster rates (on the order of the thermal lag time of the workpiece, for example) may result in larger thermal gradients in the workpiece. For example, ramp rates on the order of 50° C. per second may well be adequate for some applications, whereas much faster ramp rates may be acceptable for other applications.

Additionally, in the present embodiment the system 30 includes a corrective energy source 66 mounted beneath a quartz window 67 in the wall 52 of the radiation absorbing chamber 48. The corrective energy source supplies additional heating to cooler regions of the workpiece 34 during a thermal cycle, to increase the uniformity of the temperature distribution in the workpiece, thereby reducing lattice damage caused by thermal stresses. More particularly, in this embodiment the corrective energy source is similar to that disclosed in the above-noted commonly-owned U.S. Pat. No. 6,303,411. Alternatively, however, the corrective energy source 66 may be omitted entirely, or other types of corrective energy sources may be substituted.

Heating Device

Still referring to FIG. 2, in this embodiment the heating device 36, or more particularly the second irradiance source 44, includes a source of thermal flux energy, to rapidly heat the surface 38 to the desired temperature. More particularly, in this embodiment the heating device 36 includes a flash lamp 68 operable to irradiate the workpiece 34, or more particularly the surface 38, with electromagnetic radiation. The flash lamp 68 includes a VORTEK(™) double water wall arc lamp similar to that disclosed in the above-noted commonly-owned Patent Cooperation Treaty application Ser. No. PCT/CA01/00051. The flash lamp 68 includes a power supply system 69, which in this embodiment includes not only a continuous power supply similar to that provided in the pre-heating device 32 for operating the flash lamp in a continuous mode if desired, but also includes a pulsed discharge unit that may be pre-charged then abruptly discharged in order to supply a "spike" of input power to the flash lamp 68. More particularly, in this embodiment the power supply system 69 of the flash lamp includes a power supply model number VT-20 pulsed discharge unit manufactured by Rapp OptoElectronin of Hamburg, Germany, operable to produce pulses of up to 60 kJ within a one-millisecond discharge time. Alternatively, other types of power supplies operable to supply abrupt spikes of input power may be substituted. For example, a power supply model number PS5010 manufactured by EKSMA Company of Vilnius, Lithuania may be suitable for many applications. Preferably, any such power supply has a switching frequency of at least 2 kHz, and a power output of at least 500 kW, however, these preferred characteristics are not essential and may be varied if desired.

More generally, other types of flash lamps, or more broadly, other heating devices, may be substituted. However, the VORTEK(™) double water wall arc lamp is preferred, as it can produce much higher-powered flashes than other types of heating devices. In this regard, the heating device 36 preferably includes a minimal number of heat sources, most preferably a single source, in order to simplify control of the heating device and to improve uniformity of the irradiance field, without the need for ongoing calibration of a large number of sources. Use of an arc lamp is favored because the arc lamp has significantly higher power output capabilities as compared to other types of heat sources, such as tungsten filament lamps, for example. Conventional arc lamps may experience difficulties in producing a flash at the power levels disclosed herein, due to severe thermal stresses imposed upon the quartz windows surrounding the arc resulting not only from conduction of heat from the arc, but also from absorption within the quartz windows of radiation from the arc. In conventional arc lamps, these resulting thermal stresses may cause the quartz window surrounding the arc to violently shatter. The VORTEK (™) double water wall arc lamp addresses these difficulties, and is therefore capable of safely producing much higher-power flashes than conventional arc lamps, making it ideally suited for the application of the present embodiment where a single lamp or limited number of lamps are used.

In response to a discharge of the power supply system 69, the flash lamp 68 is operable to produce a flash of electromagnetic radiation with a power output of 4–6 MW ranging from 1–5 ms in duration. For example, a 6 MW flash of 1 ms duration may be advantageous for some applications. By producing such a flash when the workpiece is at the intermediate temperature, the heating device 36 is operable to heat the surface 38 of the workpiece from the intermediate temperature to the desired temperature. In embodiments where the workpiece 34 is a silicon semiconductor wafer, the heating device is operable to heat the surface 38 to a desired temperature which is usually in the range of 1050° C. to 1430° C.

The flash lamp 68 is advantageous for the purposes of the present embodiment, in comparison to other ultra-fast heating devices. For example, although excimer lasers have been previously used for some annealing purposes, the monochromatic radiation produced by a laser tends to give rise to optical interference effects produced by thin films which coat the surface of a semiconductor wafer workpiece and which are intentionally laterally inhomogeneous. Such optical interference effects produce lateral temperature gradients which result in thermal stress damage to the lattice of the workpiece. The flash lamp 68 is less susceptible to such interference effects than lasers, due to the broader spectrum of the electromagnetic radiation produced by the flash lamp. In addition, laser annealing typically requires multiple heating cycles, such as hundreds of cycles for example, to anneal the entire workpiece surface, and accordingly, if a laser were substituted as the heating device, the workpiece likely would spend a longer amount of time at the intermediate temperature, resulting in deeper dopant diffusion. Also, use of a laser as the heating device tends to produce lower quality junctions than the flash lamp, resulting in higher current leakage. In addition, the faster ramp time associated with lasers (typically two orders of magnitude faster than that associated with the flash lamp) tends to produce higher thermal gradients, increasing the likelihood of lattice damage. Finally, due to the extremely shallow heat penetration resulting from laser annealing, it is sometimes not possible to achieve proper annealing of a desired layer such as a thin gate that lies underneath an intervening layer, due to "shadowing" by the intervening layer, whereas in contrast the flash lamp tends to heat the entire surface region, including the intervening and underlying layer, to sufficient annealing temperatures.

Alternatively, however, if desired, other types of heating devices may be substituted for the flash lamp 68. For the purposes of the present embodiment, it is desirable that any alternative heating device have a response time faster than the thermal conduction time of the workpiece 34 (typically on the order of 10–15 ms) and be capable of heating the second side 46 of the workpiece from the intermediate temperature to the desired temperature in less time than the thermal conduction time of the workpiece, so that the bulk of the workpiece 34 will remain at substantially the intermediate temperature in order for the bulk to act as a heat sink to facilitate rapid cooling of the second side 46 from the desired temperature to the intermediate temperature.

In this embodiment, the heating device 36 further includes a reflector 70. In this embodiment the reflector 70 is formed by a series of flat segments forming a trough shape, so as to cooperate with the flash lamp 68 to produce a generally uniform irradiance field. In this embodiment, the reflector 70 includes a reflector manufactured by Vortek Industries Ltd., of Vancouver, Canada. Alternatively, the reflector 70 may be omitted or replaced with other reflectors, although it is desirable that the irradiance field be generally uniform.

The flash lamp 68 is positioned at a focal point of the reflector 70, and the flash lamp and the reflector are positioned to irradiate the second side 46 of the workpiece 34 with a substantially uniform irradiance field at an angle of incidence of 45 degrees relative to the surface of the second side 46 of the workpiece 34.

In this embodiment, the radiation absorbing chamber 48 further includes a quartz window 71 extending between the walls 50 and 54 of the radiation absorbing chamber. The quartz window 71 serves to isolate the flash lamp 68 and the reflector 70 from the interior of the radiation absorbing chamber 48, to prevent contamination of the workpiece.

Selective-filtering System

Referring to FIG. 2, in this embodiment the absorption system of the cooling enhancement system 47 includes a selective-filtering system. More particularly, the selective-filtering system includes a first filtering device, which in this embodiment includes the quartz window 65. The first filtering device, or more particularly, the quartz window 65, is interposed between the pre-heating device 32 and the workpiece 34, and is configured to transmit radiation produced by the pre-heating device to the workpiece, to pre-heat the workpiece to the intermediate temperature. More particularly still, the first filtering device is configured to transmit the radiation to a surface of the workpiece, which in this embodiment includes the substrate side, referred to herein as the first side 42. The first filtering device is further configured to absorb radiation thermally emitted by the workpiece.

Similarly, in this embodiment the selective-filtering system further includes a second filtering device, which in this embodiment includes the quartz window 71. The second filtering device, or more particularly, the quartz window 71, is interposed between the heating device 36 and the workpiece 34 and is configured to transmit radiation produced by the heating device to the surface 38 of the workpiece, to heat the surface to the desired temperature greater than the intermediate temperature. The second filtering device is further configured to absorb radiation thermally emitted by the workpiece.

Figures 2A, 6A, 7A:
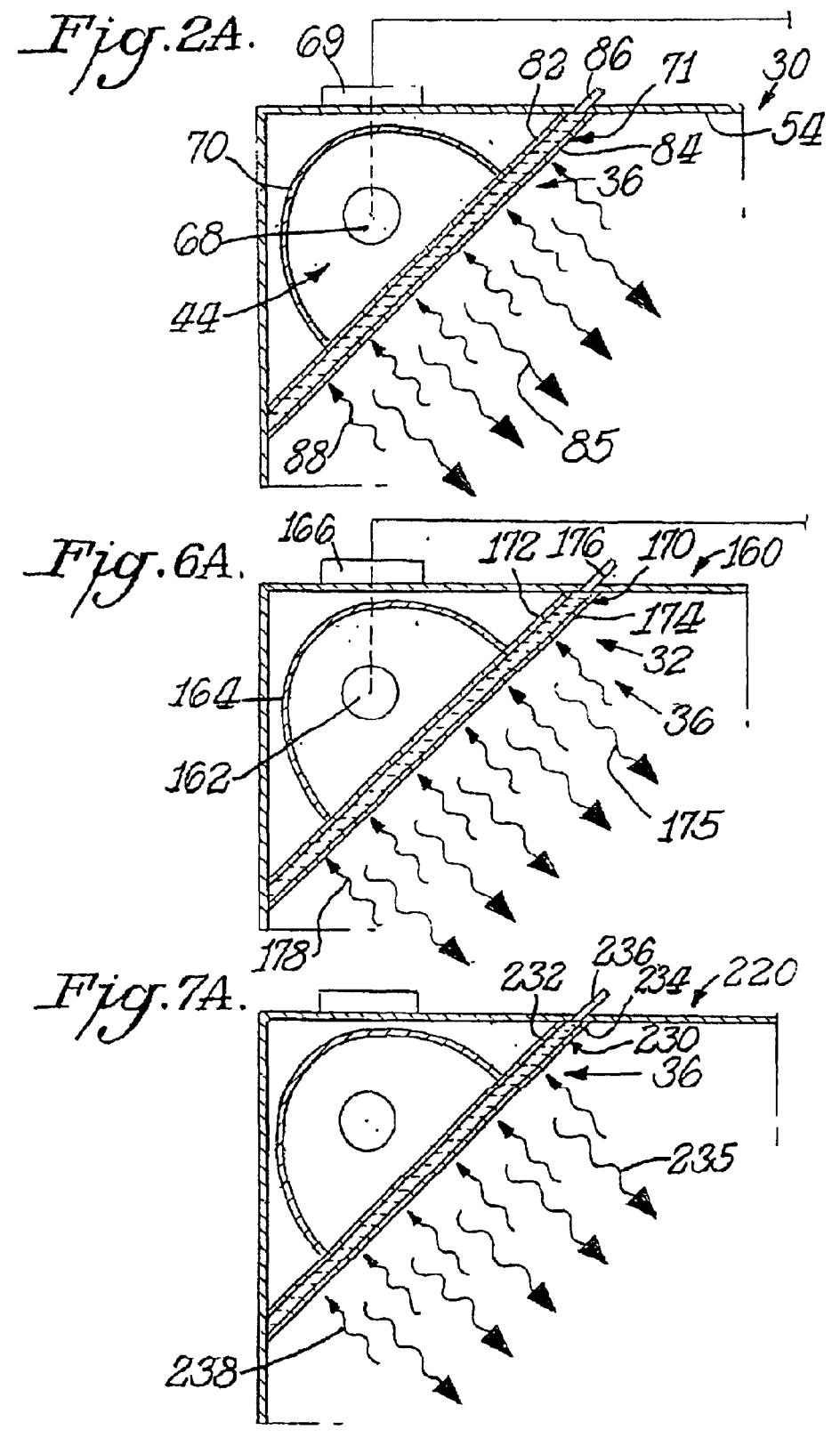

Referring to FIGS. 2 and 2A, in this embodiment the second filtering device of the selective-filtering system of the cooling enhancement system 47 includes at least one window, which in this embodiment is the quartz window 71. More particularly, in this embodiment the quartz window 71 includes first and second spaced apart windows 82 and 84, which in this embodiment are constructed of quartz. In this embodiment the windows 82 and 84 are optically transparent, and define a fluid channel 86 interposed therebetween. The optically transparent windows preferably have a thickness in the range of 2 to 10 mm and are spaced apart approximately 2 to 5 mm, preferably about 3 mm.

In this embodiment, the heat-treating system 30 further includes the cooling subsystem 58 for cooling the selective-filtering system, or more particularly, for cooling the first and second filtering devices thereof. To achieve this, in the present embodiment the cooling subsystem 58 includes a liquid-cooling subsystem for causing a liquid to flow across a surface of the window 71. More particularly still, in this embodiment the liquid-cooling subsystem causes a liquid to flow in a space, namely the fluid channel 86, defined between the windows 82 and 84. Thus, in this embodiment, a cooling fluid, preferably a liquid such as water, more preferably purified water and most preferably deionized water is pumped through the fluid channel 86. The cooled window 71 having water pumped through fluid channel 86 readily transmits visible and near-visible radiation (represented by wave lines 85) having wavelengths from about 0.2 to 1.4 μm from the flash lamp 68 to the workpiece, yet also absorbs infrared radiation of wavelengths greater than 1.4 μm emitted from the workpiece (represented by wave lines 88). By absorbing longer wavelength radiation emitted radiantly by the workpiece, the cooled window 71 actively promotes workpiece cooling and reduces or eliminates reflections of workpiece-emitted radiation back to the workpiece. This system 30 provides greater control and maximizes cooling of the workpiece. After absorbing radiation, the water is pumped away from the window to further enhance cooling, as such pumping prevents the cooled window 71 and the water therein from heating up and beginning to thermally emit radiation. Radiation absorbed by the water does not return to the workpiece where it would be reabsorbed. In contrast, conventional highly reflective systems (not radiation absorbing chambers) return most such radiation emitted by the wafer back to the wafer.

Thus, in this embodiment the cooled window 71 includes a first optically transparent plate (the window 82) cooled by a cooling fluid, and further includes a second optically transparent plate (the window 84) separated from the first optically transparent plate to define a passageway (the fluid channel 86) through which the cooling fluid may flow.

In this embodiment, the quartz window 65 shown in FIG. 2 interposed between the pre-heating device 32 and the workpiece 34 is structurally similar to the quartz window 71. Therefore, in this embodiment the window 65 is also liquid-cooled, or more particularly, is a water-cooled quartz window.

Thus, in the present embodiment, in which the workpiece 34 is a semiconductor wafer, the system 30 effectively acts as a semiconductor heating apparatus, including a first heating source (one of the pre-heating device 32 and the heating device 36) for heating a first surface of a semiconductor wafer, a second heating source (the other one of the pre-heating device 32 and the heating device 36) for heating a second surface of the semiconductor wafer, and a first cooled window (one of the windows 65 and 71) disposed between the first heating source and the semiconductor wafer. The apparatus of the present embodiment further includes a second cooled window (the other one of the windows 65 and 71) disposed between the second heating source and the semiconductor wafer. The first and second cooled windows absorb radiation thermally emitted by the semiconductor wafer, to controllably cool the semiconductor wafer at a rate of at least 100° C. per second.

Control Device

Referring to FIG. 2, in this embodiment the system 30 further includes a processor circuit 72, which in the present embodiment is housed within a general purpose computer 74. The processor circuit 72 is in communication with the pre-heating device 32 and the heating device 36. In addition, in embodiments such as the present embodiment in which the temperature indicator 60 and the corrective energy source 66 are provided, the processor circuit is in further communication with such devices.

In this embodiment (FIG. 2), the computer 74 further includes a storage device 76 in communication with the processor circuit 72. More particularly, the storage device 76 includes a hard disk drive and a random access memory. The computer 74 further includes an input device 78, which in this embodiment is a keyboard, and an output device 80, which in this embodiment is a color monitor. Alternatively, however, other storage, input and output devices may be substituted. Or, as a further alternative, the processor circuit may be omitted entirely and replaced with any other suitable means for controlling the pre-heating and heating devices 32 and 36 in accordance with the methods exemplified herein.

Operation

Figure 3:
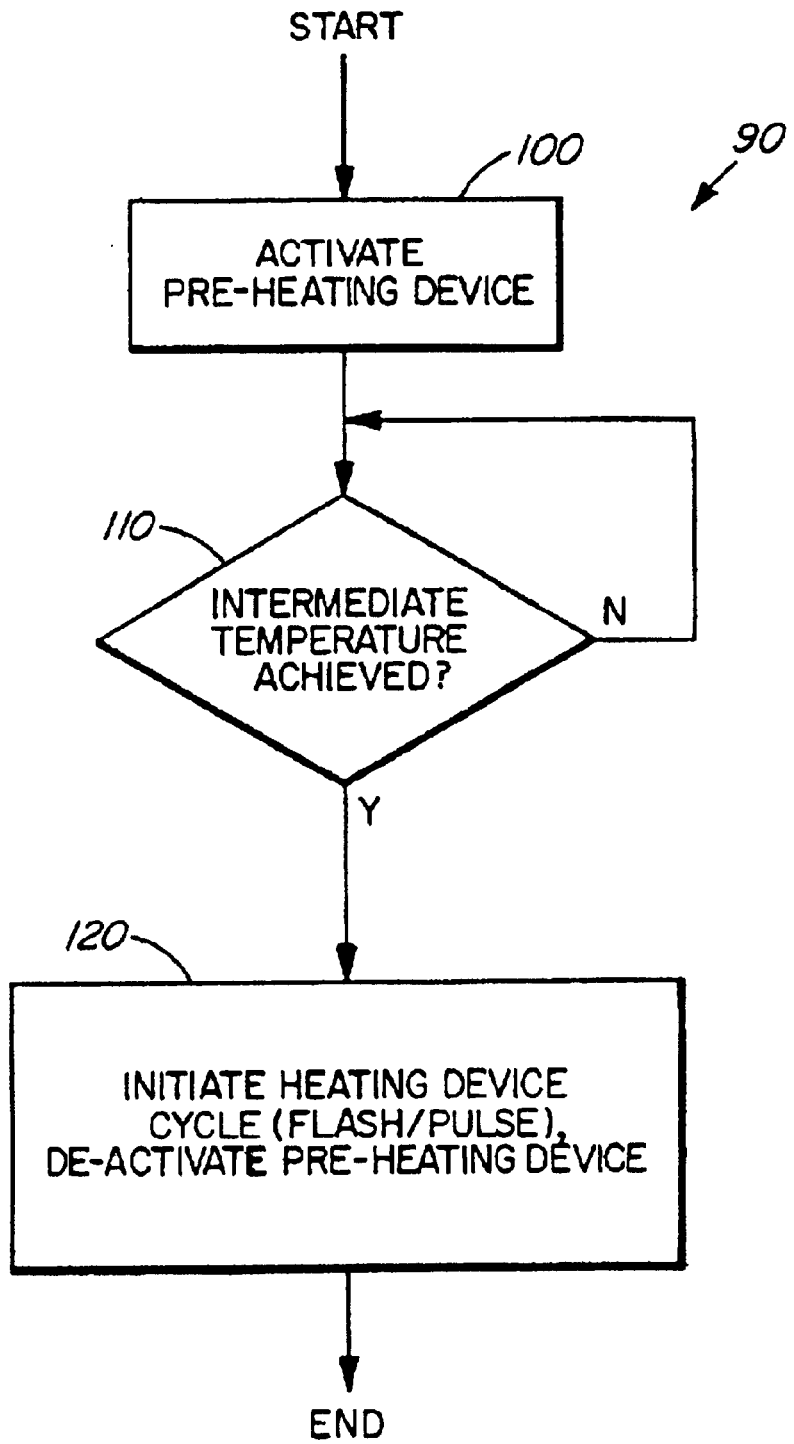
FIG. 3 is a flowchart of a heat-treating routine executed by a processor circuit of the system shown in FIG. 2.
Figure 4:
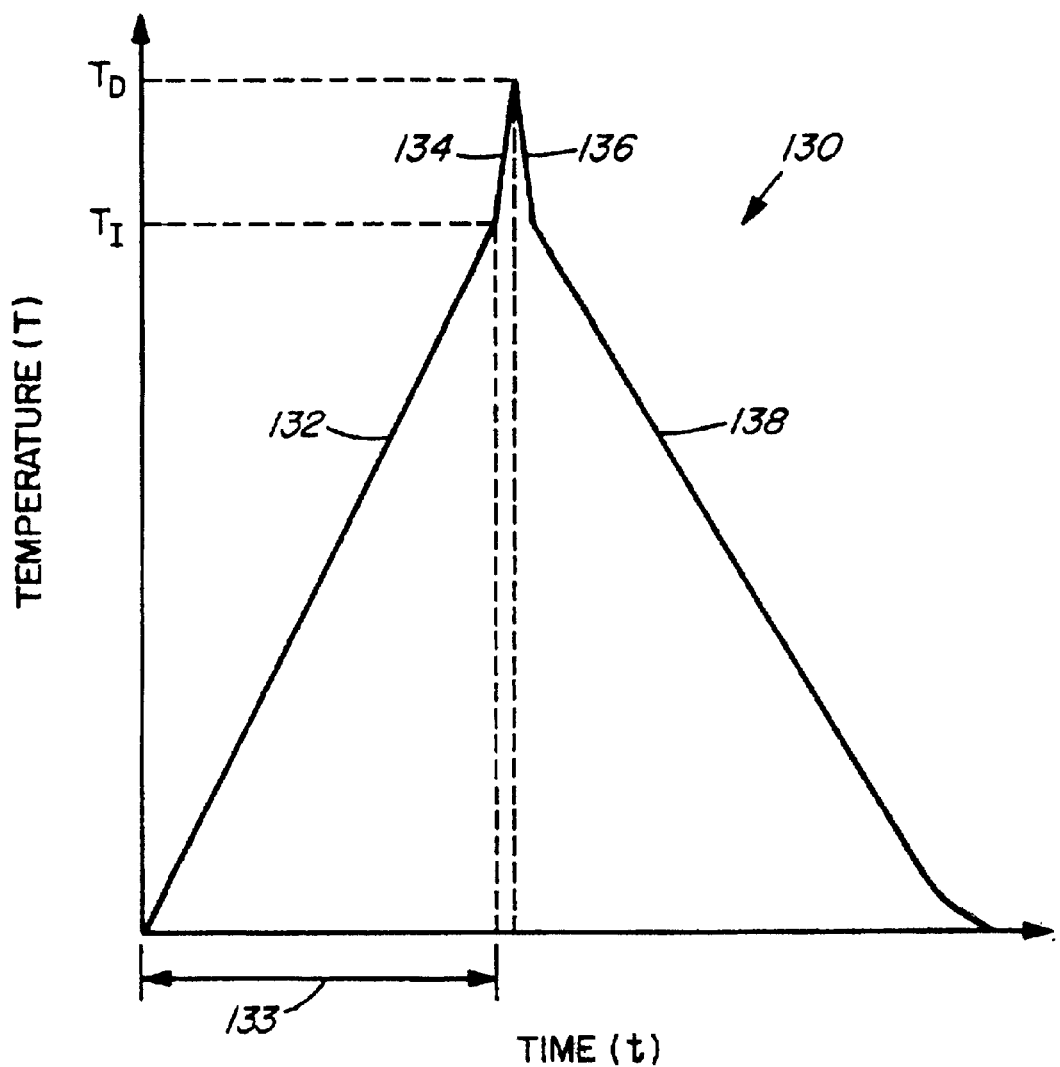
FIG. 4 is a graphical representation of a temperature-time profile of a surface of the workpiece shown in FIG. 2 during a thermal cycle according to the second embodiment of the invention.

Referring to FIGS. 2, 3 and 4, in this embodiment the storage device 76 shown in FIG. 2 stores blocks of codes for directing the processor circuit 72 to execute a heat-treating routine shown generally at 90 in FIG. 3. The heat-treating routine is executed by the processor circuit in response to user input received at the user input device 78 indicating that a heat-treating cycle is to commence.

Generally, in this embodiment, the heat-treating routine 90 configures the processor circuit 72 to control the pre-heating device 32 and the heating device 36 to pre-heat the workpiece 34 to an intermediate temperature, and to heat the surface 38 of the workpiece 34 to a desired temperature greater than the intermediate temperature. In this embodiment, the heating commences within less time following the first time period than the first time period. More particularly, in this embodiment the heating commences substantially immediately when the workpiece reaches the intermediate temperature. Also in this embodiment, the desired temperature is greater than the intermediate temperature by an amount less than or equal to about one-fifth of a difference between the intermediate temperature and an initial temperature of the workpiece.

Generally, throughout the execution of the heat-treating routine 90, the walls 50, 52, 54 and 56 of the radiation absorbing chamber 48 absorb radiation reflected and thermally emitted by the workpiece 34, and the quartz windows 65 and 71 similarly absorb radiation thermally emitted by the workpiece, thus enhancing cooling of the workpiece. The cooling subsystem 58 cools these walls and windows to prevent them from becoming hot in response to such absorption and re-emitting such absorbed energy as blackbody radiation. Alternatively, however, such absorption and cooling may be omitted at the expense of temperature uniformity in the workpiece during the execution of the heat-treating routine, and at the further expense of deeper dopant diffusion resulting from slower cooling rates.

The heat-treating routine 90 begins with a first block 100 of codes shown in FIG. 3, which directs the processor circuit 72 to pre-heat the workpiece 34 to an intermediate temperature. To achieve this, block 100 directs the processor circuit to activate the pre-heating device 32, or more particularly the first irradiance source 40, to irradiate the first side 42 of the workpiece 34 to pre-heat the workpiece to the intermediate temperature. More particularly, block 100 directs the processor circuit to control the arc lamp 62 shown in FIG. 2 to continuously irradiate the first side 42 of the workpiece with a constant radiation intensity of approximately $1.4 \times 10^2$ W/cm$^2$, which it has been found is sufficient to pre-heat the workpiece at a ramp rate moderately in excess of 400° C. per second. Thus, in this embodiment irradiating the workpiece involves exposing the workpiece to electromagnetic radiation produced by an arc lamp.

Block 100 also directs the processor circuit 72 to initialize the heating device 36, which in this embodiment is achieved by charging the power supply system 69 of the flash lamp 68 shown in FIG. 2.

In addition, in embodiments in which the corrective energy source 66 shown in FIG. 2 is to be used, block 100 further directs the processor circuit 72 to control the corrective energy source 66 to produce a desired spatial temperature distribution across the workpiece during the pre-heating stage, as described in greater detail in the above-noted commonly-owned U.S. Pat. No. 6,303,411. Alternatively, the corrective energy source 66 may be omitted.

Block 110 then directs the processor circuit 72 to determine whether the intermediate temperature has been achieved in the workpiece. In this embodiment, block 110 directs the processor circuit to achieve this by monitoring signals received from the temperature indicator 60 shown in FIG. 2 indicative of the temperature of the workpiece 34. Alternatively, however, block 110 may direct the processor circuit to act as a temperature indicator, to produce an indication of a temperature of the workpiece based on the time elapsed since the pre-heating device was activated at block 100, in view of a predicted heating rate corresponding to the intensity of radiation incident upon the workpiece, to determine whether the intermediate temperature has been achieved. Although the magnitude of the intermediate temperature will vary from application to application, in the present embodiment the intermediate temperature is 1000° C. and therefore, this temperature will be achieved in the workpiece after approximately 2.5 seconds of irradiation of the workpiece by the pre-heating device 32. In effect, therefore, blocks 100 and 110 direct the processor circuit to control the pre-heating device 32 to pre-heat the workpiece for a time period greater than a thermal conduction time of the workpiece (which is on the order of 10–15 ms).

Upon determining at block 110 that the intermediate temperature has been achieved in the workpiece 34, block 120 directs the processor circuit 72 to heat the surface 38 of the workpiece 34 to a desired temperature that is greater than the intermediate temperature. In this embodiment, the desired temperature exceeds the intermediate temperature by an amount less than or equal to about one-fifth (or more particularly, less than or equal to about one-twentieth) of a difference between the intermediate temperature and the initial temperature of the workpiece. As stated, in this embodiment, preferred intermediate temperatures are in the range of about 600° C. to 1250° C., and preferred desired temperatures are in the range of about 1050° C. to about 1430° C. (which very roughly corresponds to a melting point of silicon). In this embodiment, this heating stage commences within less time following the first time period (during which the workpiece temperature was increasing to the intermediate temperature) than the first time period. More particularly, as a result of the execution of block 110 and 120, the heating device 36 is operable to commence the heating of the surface 38 of the workpiece in response to the indication from the temperature indicator 60 that the temperature of the workpiece 34 is at least the intermediate temperature, or alternatively, where the temperature indicator is omitted for example, the heating device is operable to commence such heating at an end of the first time period (during which the temperature of the workpiece was increasing to the intermediate temperature).

In other words, in this embodiment the heating device 36 is operable to commence heating the surface 38 substantially immediately when the workpiece 34 reaches the intermediate temperature. In this regard, in the present embodiment the heating device is operable to commence the heating of the surface within less than one second after the workpiece reaches the intermediate temperature. More particularly, the heating device is operable to commence the heating of the surface within less than one-quarter second after the intermediate temperature is reached. More particularly still, in this embodiment the heating device is operable to commence such heating within less than 100 milliseconds, or more particularly within 10 milliseconds, after the workpiece reaches the intermediate temperature. Effectively, therefore, as the thermal conduction time through the workpiece is on the order of 10–15 ms, in this embodiment the heating device is operable to commence the heating of the surface within an interval following the arrival of the workpiece at the intermediate temperature, the interval having a duration less than or equal to a thermal conduction time of the workpiece. In this regard, for some applications it may be desirable to delay commencement of the heating stage until slightly after the deactivation of the pre-heating device, to allow for the thermal lag of the workpiece (on the order of 10–15 ms). However, any delay longer than this 10–15 ms workpiece conduction time in commencing this heating stage will tend to increase dopant diffusion in the workpiece. Therefore, in general it is preferable not to delay the commencement of the heating stage at all, but if a delay is desired for a particular application, it is typically undesirable to "hold" the workpiece temperature at the intermediate temperature for longer than the time taken to heat the workpiece from its initial temperature to the intermediate temperature.

To commence the heating stage in the present embodiment, block 120 directs the processor circuit 72 to deactivate the pre-heating device 32 (including the corrective energy source 66 if a corrective energy source is provided), and to activate the heating device 36 to heat the surface 38 of the workpiece to the desired temperature. More particularly, in this embodiment, block 120 directs the processor circuit 72 to commence the heating stage by controlling the second irradiance source 44 to irradiate the second side 46 of the workpiece 34 to heat the second side to the desired temperature, which is greater than the intermediate temperature. The processor circuit is directed to achieve this by signaling the flash lamp 68 shown in FIG. 2, to cause the flash lamp power supply system 69 to be discharged to produce a short-duration, high energy arc in the flash lamp, which irradiates the surface 38 of the workpiece at a power of approximately 5 MW, for a duration on the order of 1 ms. Thus, in this embodiment irradiating the surface 38 involves exposing the surface to electromagnetic radiation produced by a flash lamp.

This flash heats the surface 38 of the workpiece to the desired temperature, which in this embodiment is 1050° C. At this high temperature and corresponding high kinetic energies, the dopant atoms implanted in the surface 38 of the workpiece tend to eject silicon atoms from the lattice and occupy substitutional lattice sites formerly occupied by silicon atoms. The dopants thereby become electrically activated. The displaced silicon atoms tend to migrate toward interstitial sinks such as the surface 38 of the workpiece, where they tend to be consumed by other processes such as oxidation.

The heat-treating routine 90 is then ended.

Referring to FIG. 4, a temperature-time profile of the surface 38 of the workpiece 34 resulting from the foregoing execution of the heat-treating routine 90 is shown generally at 130. The temperature-time profile 130 has four distinct stages, namely, a bulk pre-heating stage 132, a surface heating stage 134, a surface cooling stage 136 and a bulk cooling stage 138.

Referring to FIGS. 2, 3 and 4, the bulk pre-heating stage 132 results from the execution by the processor circuit 72 of blocks 100 and 110, and serves to pre-heat the workpiece 34 by increasing its temperature over a first time period 133 from its initial temperature to the intermediate temperature. More particularly, in this embodiment, the pre-heating device 32 increases the temperature of the entire workpiece 34 from its initial temperature (room temperature) to an intermediate temperature of 1000° C. at a ramp rate of approximately 400° C. per second. Pre-heating the workpiece in this manner to the intermediate temperature, and in particular to an intermediate temperature that is relatively close to the desired temperature, serves to reduce the magnitude of the temperature gradients that occur in the workpiece during the subsequent surface heating stage 134 and therefore serves to reduce thermal stress damage to the lattice of the workpiece, in comparison to techniques such as laser annealing or microwave annealing. However, the relatively fast ramp rate of the bulk pre-heating stage 132 and the correspondingly short time period spent by the workpiece at high temperatures results in much less dopant diffusion in the workpiece than other cycles that use slower ramp rates or that hold the workpiece at an intermediate temperature before the subsequent heating stage. In other words, in this embodiment, the duration of the bulk pre-heating stage 132, while longer than the thermal conduction time of the workpiece, is short compared to a characteristic time required for unacceptable diffusion to occur at the temperatures obtained during the bulk pre-heating stage.

The surface heating stage 134 results from the flash produced by the heating device 36 at block 120, and serves to heat the surface 38 of the workpiece from the intermediate temperature to the desired temperature. As shown in FIG. 4, such heating of the surface commences within less time following the first time period 133 than the first time period 133. More particularly, in this embodiment the heating commences substantially immediately following the end of the first time period 133, as soon as the intermediate temperature is achieved in the workpiece 34. In this embodiment the flash increases the temperature of the surface 38 from the intermediate temperature of 1000° C. to the desired annealing temperature of 1050° C. in approximately one millisecond. Due to the short duration of the flash (on the order of 1 ms), the heating device 36 is operable to heat the surface 38 of the workpiece for a time period less than a thermal conduction time of the workpiece (on the order of 10–15 ms). Therefore, the heating device 36 heats the surface 38 of the workpiece much faster than such heat can conduct away from the surface 38 and into the workpiece, and as a result, the bulk of the workpiece remains substantially at the intermediate temperature while the surface 38 is heated to the desired temperature.

Thus, during the surface cooling stage 136 that immediately follows the flash, the relatively cold bulk of the workpiece 34 acts as a heat sink for the surface 38, allowing the surface 38 to cool at a significantly faster rate than it would have cooled if the entire workpiece had been heated to the desired temperature. This rapid cooling continues until the surface 38 has reached the same temperature as the remainder of the workpiece 34 (approximately the intermediate temperature). Typically, the duration of this surface cooling stage 136 is on the order of the duration of the surface heating stage 134. As an illustrative example, a surface of a silicon semiconductor wafer may cool at a rate of 10,000° C. per second for example, depending on the (intermediate) temperature of the bulk of the wafer.

As a result of this ultra-fast heating and cooling during the surface heating and cooling stages 134 and 136, the surface 38 of the workpiece spends considerably less time in the high temperature range between the intermediate temperature and the desired temperature than it would have if the entire workpiece had been heated to the desired temperature. As most of the undesirable dopant diffusion occurs at or near the desired annealing temperature, this ultra-fast heating and cooling results in less dopant diffusion, allowing for the formation of shallower p+/n junctions than previous arc lamp or filament lamp annealing systems. At the same time, because the desired temperature exceeds the intermediate temperature by an amount less than or equal to about one-fifth (or more advantageously in the present embodiment, less than or equal to about one-twentieth) of the difference between the intermediate and initial temperatures, the temperature gradients in the workpiece during these heating and cooling stages are much smaller than those that occur in conventional laser annealing techniques, resulting in less thermal stress damage to the crystal lattice.

When the surface 38 has cooled to the same temperature as the bulk of the workpiece 34 (approximately the intermediate temperature), the bulk cooling stage 138 then commences, in which the surface 38 cools along with the bulk of the workpiece 34. In this embodiment, such cooling results largely from blackbody radiation thermally emitted by the hot workpiece, but also results partly from convection involving gases (if any) in the vicinity of the workpiece. The rate of such bulk cooling is strongly dependent on temperature and also depends on other factors such as the absorptiveness or reflectivity of the chamber, for example. In this embodiment the bulk cooling stage initially commences at a ramp rate of approximately $-180°$ C./s, although this rate decreases somewhat as the workpiece cools. Advantageously, the radiation absorbing properties of the cooling enhancement system 47 and radiation absorbing chamber 48 allow faster bulk cooling rates than conventional reflective chambers.

As discussed above in connection with FIG. 2A, additional means to controllably cool the workpiece 34 from the intermediate temperature are provided. While the thermal flux heating ceases upon de-activation of the flash lamp 68, and cooling of the second side 46 from the desired temperature to the intermediate temperature occurs rapidly during the surface cooling stage 136 as discussed above, cooling from the intermediate temperature to room temperature (or to a temperature below the intermediate temperature at which the workpiece is removed from the system) does not proceed rapidly without assistance. Thermal exposure may be undesirably large if the workpiece remains at or close to the intermediate temperature for prolonged periods (e.g. 0.3 seconds or longer). The water-cooled walls 50, 52, 54 and 56 of the radiation absorbing chamber 48 and the cooled windows 71 and 65 associated with the heating device 36 and the pre-heating device 32, absorb radiation emitted from the workpiece at wavelengths of 1.4 $\mu$m and above. For the example of a silicon semiconductor wafer, this represents on the order of 95% of the radiation emitted from the workpiece. In combination, the radiation absorbing chamber 48 and cooled windows 71 and 65 thus controllably cool the workpiece by removing from the radiation absorbing chamber 48 radiation emitted by the workpiece, preventing re-reflections of the radiation onto the workpiece. An example of such controlled cooling is illustrated by the bulk cooling stage 138 slope of the graph of FIG. 4.

Although only a single heat-treating routine 90 was described above for illustrative purposes, alternatively a plurality of different heat-treating routines may be stored in the storage device 76 for directing the processor circuit 72 to control the system 30 to execute a plurality of different corresponding thermal heat-treating cycles for different applications. For example, the workpiece 34 may be pre-heated for different times and/or at different rates to different intermediate temperatures, and the second side 46 of the workpiece may then be heated with different power levels for different durations to different desired temperatures, depending upon the particular application.

Further Alternatives

If desired, pre-heating devices and heating devices other than the arc lamp and flash lamp may be substituted.

Figure 5:
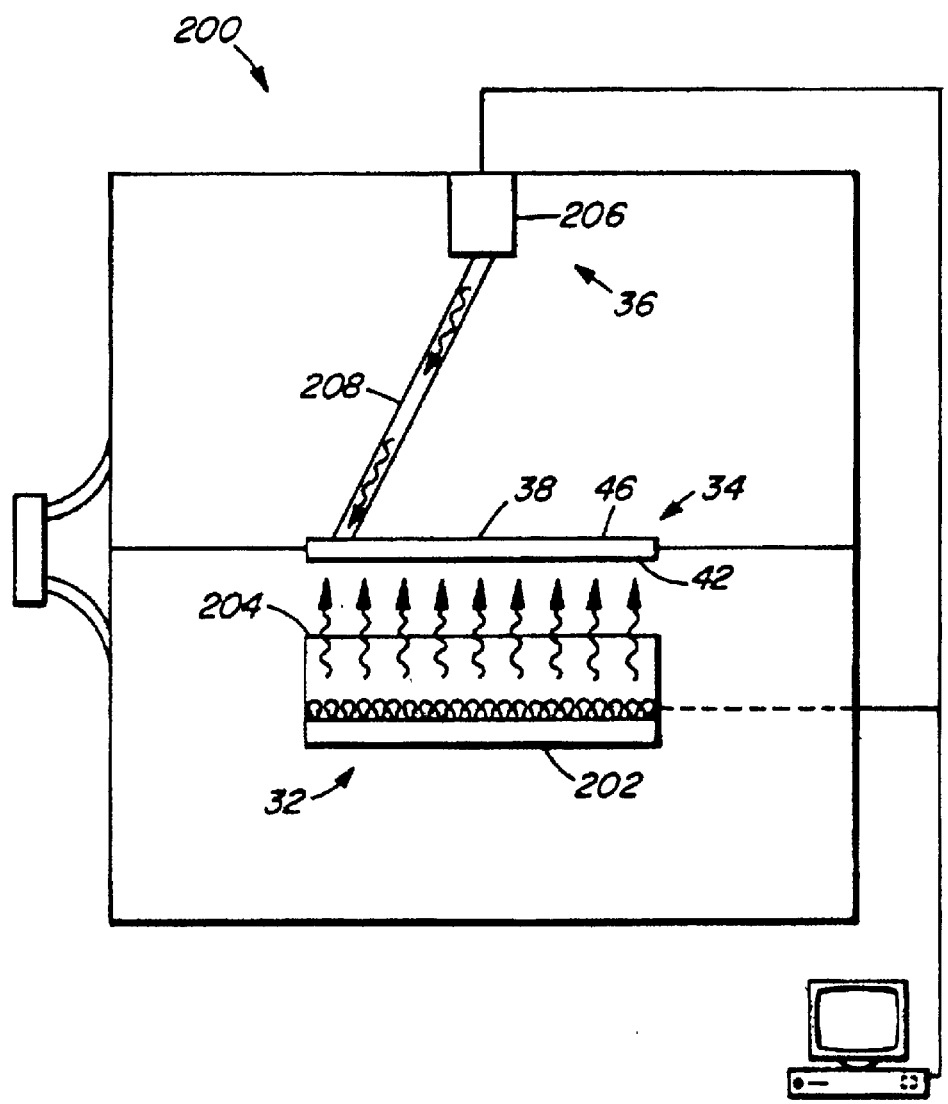
FIG. 5 is a schematic side view of a system for heat-treating a workpiece according to a third embodiment of the invention (shown with a side wall removed)

For example, referring to FIGS. 2 and 5, a system for heat-treating a workpiece according to a third embodiment of the invention is shown generally at 200 in FIG. 5. In this embodiment, the pre-heating device 32 includes an alternative irradiance source, which in this embodiment includes at least one filament lamp. Thus, in this embodiment, irradiating the workpiece includes exposing the workpiece to electromagnetic radiation produced by at least one filament lamp. More particularly, in this embodiment the pre-heating device 32 includes a disc-shaped array 202 of tungsten filament lamps operable to project electromagnetic radiation through a quartz window 204 to irradiate the first side 42 of the workpiece 34, to pre-heat the workpiece to the intermediate temperature. Although there are numerous advantages to using an arc lamp rather than a tungsten filament lamp array as the pre-heating device 32, as discussed earlier herein, the deeper dopant diffusion that tends to result from tungsten filament lamps may not necessarily be fatal for all applications, depending on the performance requirements in a particular application.

As a further example, still referring to FIGS. 2 and 5, in the alternative system 200 shown in FIG. 5, the heating device 36 includes a source of adiabatic energy, to rapidly heat the surface 38 to the desired temperature. More particularly, in this embodiment the heating device includes a laser 206, such as an excimer laser or other suitable laser, operable to irradiate the surface 38 by moving a laser beam 208 across the surface. The laser 206 is operable to produce a rapid laser pulse, on the order of microseconds or nanoseconds in duration, to heat the surface 38 to the desired temperature. Although the laser 206 may suffice for applications where the increased thermal stress damage to the lattice of the workpiece is not critical, it is noted that in general, the flash lamp 68 shown in FIG. 2 is preferred, for reasons discussed earlier herein.

Figure 6:
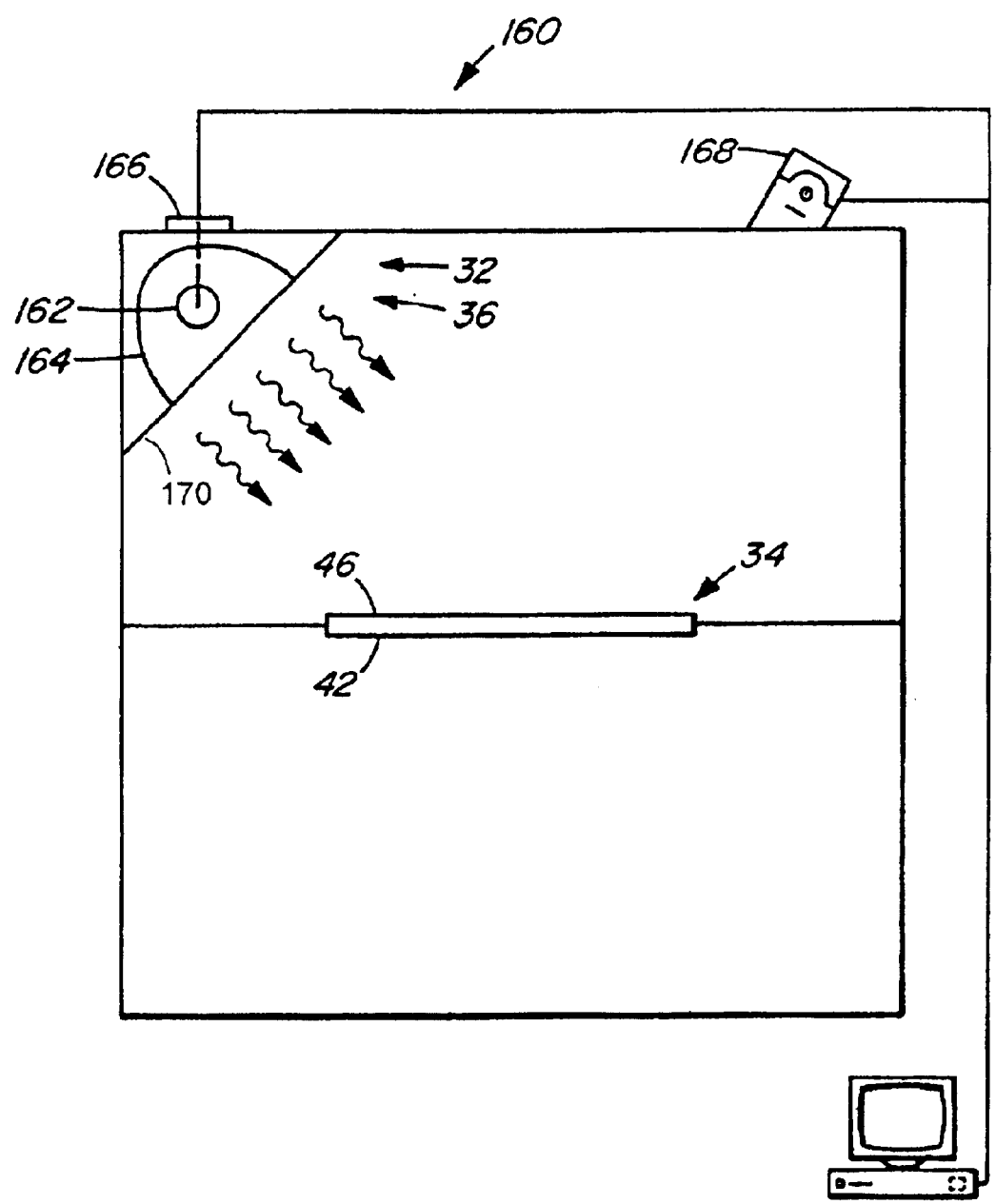
FIG. 6 is a schematic side view of a system for heat-treating a workpiece according to a fourth embodiment of the invention (shown with a side wall removed)

Referring to FIGS. 2, 6 and 6A, a system for heat-treating a workpiece according to a fourth embodiment of the invention is shown generally at 160 in FIG. 6. In this embodiment, a single arc lamp 162 functions as both the pre-heating device 32 and the heating device 36. The arc lamp 162 is similar to the arc lamp 62 shown in FIG. 2 and includes a reflector 164 for providing a substantially uniform irradiance field to irradiate the second side 46 of the workpiece, which in this embodiment is a device side of a silicon semiconductor wafer. However, the arc lamp 162 further includes a power supply system 166 similar to the power supply system 69 of the flash lamp 68 shown in FIG. 2. The power supply system 166 includes a pulsed discharge unit similar to that of the power supply system 69, which is connected in parallel with a regular continuous power supply (not shown) of the arc lamp 162.

Thus, referring to FIGS. 2, 3, 4 and 6, the arc lamp 162 may be operated in a manner similar to the arc lamp 62 shown in FIG. 2 during the bulk pre-heating stage 132 shown in FIG. 4, in accordance with the execution by the processor circuit 72 of a modified block 100 of the heat-treating routine 90. When the intermediate temperature is achieved in the workpiece, a modified block 110 directs the processor circuit 72 to disconnect the regular continuous power supply to the arc lamp 162, and to discharge the power supply system 166 to provide an abrupt spike of power to the arc lamp 162, producing a flash of similar intensity and duration to that produced by the flash lamp 68 shown in FIG. 2. Although the system 160 shown in FIG. 6 may be less expensive than the system 30 shown in FIG. 2, the system 160 supplies 100% of the heating of the workpiece to the second side 46, which in this embodiment is the device side, of the workpiece. As the device side is much more inhomogeneous than the substrate side (the first side 42) of the workpiece, non-uniform absorption by devices on the device side may tend to produce greater lateral temperature gradients and corresponding thermal stress damage to the lattice of the workpiece than those that would occur using the system 30. This difficulty may be alleviated somewhat by providing the system 160 with an additional corrective energy source 168 locatable to supply additional heat to cooler areas of the device side, whose operation is similar to that of the corrective energy source 66 shown in FIG. 2.

Referring to FIGS. 6 and 6A, in this embodiment a cooled window 170 extends between the chamber walls to isolate the arc lamp from the workpiece, and includes spaced-apart optically transparent windows 172 and 174, preferably constructed of quartz, having a fluid channel 176 interposed therebetween. The optically transparent windows preferably have a thickness in the range of 3 to 10 mm and are spaced apart approximately 2 to 5 mm, preferably 3 mm. A cooling fluid, preferably a liquid such as water, is pumped through the fluid channel 176. The cooled window 170 having water pumped through fluid channel 176 readily transmits visible radiation (represented by wave lines 175) from the arc lamp 162 to the workpiece, yet also absorbs infrared radiation of wavelengths greater than 1.4 $\mu$m emitted from the workpiece (represented by wave lines 178). By absorbing radiation in wavelengths emitted radiantly by the workpiece, the cooled window 170 actively promotes workpiece cooling and limits or eliminates reflections of workpiece-emitted radiation back to the workpiece. This system 160 provides greater control and maximizes cooling of the workpiece. Alternatively, however, the window 170 may be omitted or replaced with other suitable window types if desired.

Referring back to FIGS. 5 and 6, further variations in the nature, location and combinations of the pre-heating and heating devices 32 and 36 are possible. For example, lasers other than excimer lasers may be substituted for the flash lamp 68 to act as the heating device 36. Or, different types of tungsten filament lamp arrays, such as a linear tungsten lamp array, may be substituted for the arc lamp 62 to act as the pre-heating device 32.

Figure 7:
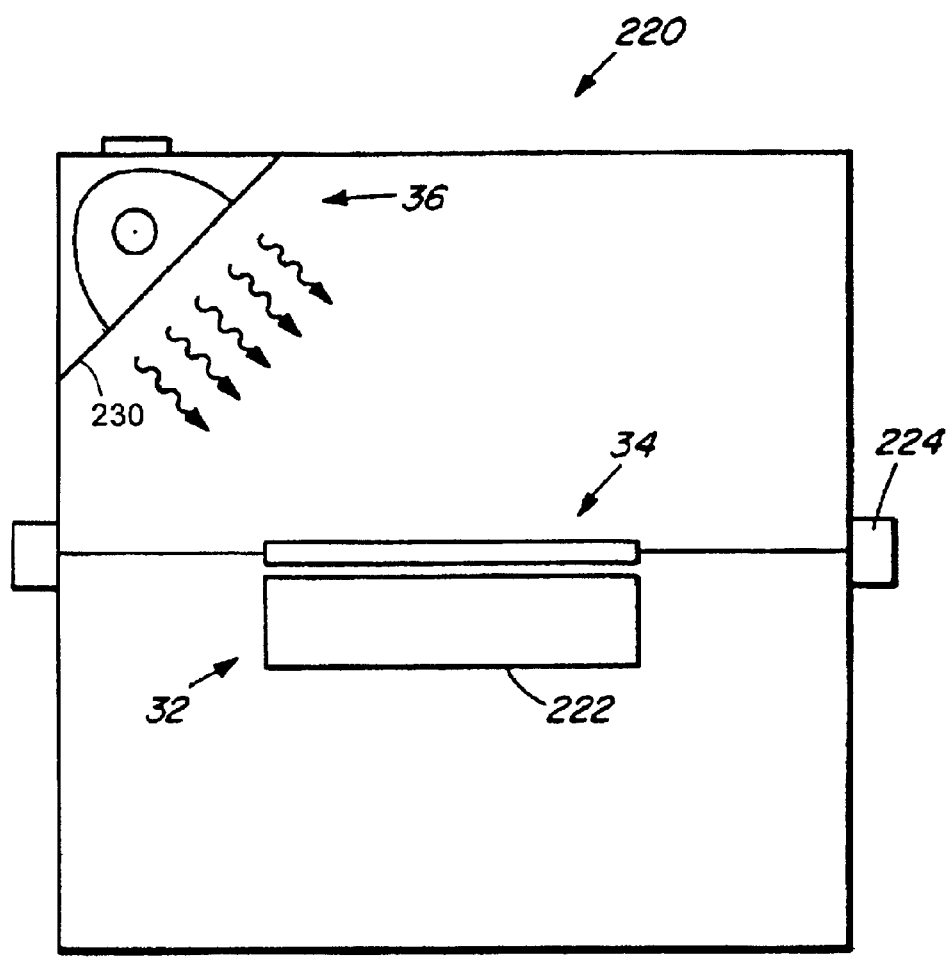
FIG. 7 is a schematic side view of a system for heat-treating a workpiece according to a fifth embodiment of the invention (shown with a side wall removed)

As a further alternative, referring to FIGS. 2, 7 and 7A, a system for heat-treating a workpiece according to a fifth embodiment of the invention is shown generally at 220 in FIG. 7. In this embodiment the pre-heating device 32 includes a radiant hot body 222 locatable to pre-heat the workpiece to the intermediate temperature. In this embodiment the hot body 222 is quartz, heated to approximately the intermediate temperature. Alternatively, other materials, such as silicon carbide, silicon, refractory metal, graphite, or a combination of such materials, for example, may be substituted. The hot body 222 is located in the radiation absorbing chamber 48 below the workpiece 34, in close proximity thereto, and is operable to pre-heat the workpiece by radiative heat transfer and also by convection and conduction through a thin layer of gas between the hot body 222 and the workpiece 34. Following the bulk pre-heating and surface heating stages 132 and 134, the hot body may be effectively "shut off" by moving the workpiece away from the hot body, or alternatively, by moving the hot body away from the workpiece. In this embodiment, this is achieved by a motorized mechanism 224 that slides the workpiece 34 out of the radiation absorbing chamber 48 following the surface heating stage.

Referring to FIGS. 7 and 7A, in this embodiment a cooled window 230 extends between the chamber walls to isolate the heating device 36 from the chamber holding the workpiece. In this embodiment, the cooled window 230 includes spaced-apart optically transparent windows 232 and 234, preferably constructed of quartz, having a fluid channel 236 interposed therebetween. The optically transparent windows preferably have a thickness in the range of 3 to 10 mm and are spaced apart approximately 2 to 5 mm, preferably 3 mm. A cooling fluid, preferably a liquid such as water, is pumped through the fluid channel 236. The cooled window 230 having water pumped through fluid channel 236 readily transmits visible radiation (represented by wave lines 235) from the lamp of the heating device 36 to the workpiece, yet also absorbs infrared radiation of wavelengths greater than 1.4 $\mu$m emitted from the workpiece (represented by wave lines 238). By absorbing radiation in wavelengths emitted radiantly by the workpiece, the cooled window 230 actively promotes workpiece cooling and limits or eliminates reflections of workpiece-emitted radiation back to the workpiece. This system 220 provides greater control and maximizes cooling of the workpiece. Alternatively, however, the window 230 may be omitted or replaced with other suitable window types if desired.

Also, if separate pre-heating and heating devices are provided, the pre-heating and heating devices need not be on opposite sides of the workpiece: for example, if desired, the pre-heating device, such as a linear tungsten lamp array, and a heating device such as a laser may be both located above the surface 38 of the workpiece, to irradiate the second or device side 46 of the workpiece (although, as noted, supplying 100% of the pre-heating and heating energy to the device side tends to produce greater temperature gradients and thermal stress damage).

Referring to FIG. 8, an apparatus for heating a workpiece according to a sixth embodiment of the invention is shown generally at 300. In this embodiment the workpiece is a semiconductor wafer, and the apparatus 300 includes a chamber housing the semiconductor wafer, the chamber having one or more walls with a radiation-reflecting surface. More particularly, in this embodiment the chamber of the apparatus 300 includes axially aligned reflective chambers 302 and 304 separated from one another by a workpiece-holding chamber 306. Each reflective chamber 302, 304 has four sidewalls with the internal sidewall surfaces coated with a reflective coating 308, 310 that reflects radiation in the wavelength ranges emitted from arc lamp sources and emitted from the workpiece. The sidewalls are slightly inwardly tapered toward the workpiece-holding chamber 306, with the angle of the taper from about 2 to 6 degrees from perpendicular, preferably about 3 degrees from perpendicular. Unlike the chamber walls 50, 52, 54 and 56 of the radiation absorbing chamber 48 in the prior embodiments (i.e., FIG. 2), the sidewalls of the chambers 302, 304 in this sixth embodiment are reflective and may not be water cooled.

Within the workpiece-holding chamber 306, the workpiece 320 is held by its outer edges on a support ring 322.

Alternatively, the workpiece could be supported on pins, or by other suitable means. As shown in FIG. 8, the workpiece 320 is a semiconductor wafer. The workpiece 320 is loaded into and unloaded from the workpiece-holding chamber 306 in a direction generally perpendicular to the axis of the chambers 302, 304 as indicated by arrow 312. The workpiece-holding chamber is sealed from the chambers 302, 304 preferably by optically transparent windows 314, 316, although such windows are not required. Process gases and/or inert gases may be introduced into the workpiece-holding chamber through conduits (not shown). For semiconductor wafer annealing processes, usually gases such as argon, nitrogen, $NH_3$, $N_2O$ and NO, and mixtures of these gases or mixtures of one or more of these gases with oxygen, are introduced into the chamber 306. Annealing may also be carried out in a vacuum.

Arc lamps 324, 326 and associated reflector assemblies 328, 330 are provided at the top and bottom of the apparatus, adjacent to the reflective chambers 302 and 304, respectively. The reflector assemblies are formed by a series of flat segments forming a trough shape, so as to cooperate with each arc lamp to produce a generally uniform irradiance field. Examples of such reflectors are manufactured by Vortek Industries Ltd. of Vancouver, Canada. Each arc lamp 324, 326 is positioned at a focal point of its associated reflector 328, 330, respectively. Each arc lamp 324, 326 and its associated reflector assembly 328, 330, respectively, are positioned to irradiate one side of the workpiece 320 with a substantially uniform irradiance field. As shown in FIG. 8, the radiant energy from arc lamp 324 irradiates the top surface 318 of the workpiece 320. The reflectors 328, 330 direct the radiant energy toward the workpiece without substantial reflection of that radiation on the reflective sidewalls of the chambers 302, 304. Optically transparent windows 332, 334 are provided to further isolate the arc lamps 324, 326 from the chambers 302, 304. The arc lamps are cooled by fluid introduced through cooling channels 336, 338 in each bulb housing.

The arc lamps 324, 326 and associated reflector assemblies 328, 330 each are separated from the adjacent chamber 302, 304 by cooled windows 340, 342. Cooled windows 340, 342 each include two optically transparent plates 344, 346 and 354, 356 spaced apart from one another and having one or more channels 348 and 358 defined in that space through which a cooling fluid, such as a liquid, preferably water, flows. The cooling liquid flows into the passages as indicated by arrows 350 and exits from the passages as indicated by arrows 360. The plates preferably are formed from quartz and have a thickness in the range of 2 to 10 mm, separated from one another about 2 to 5 mm, preferably 3 mm.

The cooled windows 340, 342 serve competing purposes. First, they readily transmit visible and near-visible radiation emitted by the arc lamps (generally at wavelengths in the range of 0.2 to 1.4 $\mu$m) to heat the workpiece without substantial attenuation or diminishment of the efficiency of heating. Second, they actively remove longer wavelength radiation emitted from the workpiece (generally at wavelengths of 1.4 $\mu$m and above) out of the chamber thus preventing reflected radiation from returning to the workpiece, which serves to controllably cool the workpiece from the intermediate temperature to room temperature or a temperature below the intermediate temperature at which the workpiece may be removed from the workpiece-holding chamber after processing. Prior heating methods in reflective cavities without cooled windows lacked means to controllably cool the workpiece and prevent excessive thermal exposure at the intermediate or higher temperatures. With the cooled windows 340, 342 of the embodiment shown in FIG. 8, the workpiece, such as a silicon semiconductor wafer, is cooled at rates in the range of 100° C. to 200° C. per second, preferably 180° C. per second or more. This compares to cooling rates of about 90° C. per second for reflective chambers without water cooled windows.

Other combinations or permutations of the above-noted pre-heating and heating devices or equivalent devices may be provided. For example, an arc lamp may be provided as the pre-heating device and a laser as the heating device, or a tungsten filament lamp array may be provided as the pre-heating device and a flash lamp as the heating device. These and other such variations may be apparent to one of ordinary skill in the art upon reviewing this specification, and are not considered to depart from the scope of the invention as construed in accordance with the accompanying claims.

More generally, while specific embodiments of the invention have been described and illustrated, such embodiments should be considered illustrative of the invention only and not as limiting the invention as construed in accordance with the accompanying claims.

What is claimed is:

1. A method of heat-treating a workpiece, the method comprising:
    a) pre-heating the workpiece to an intermediate temperature;
    b) heating an entire surface of the workpiece to a desired temperature greater than the intermediate temperature, within a time period less than a thermal conduction time of the workpiece; and
    c) enhancing cooling of the workpiece.

2. The method of claim 1 wherein enhancing comprises absorbing radiation thermally emitted by the workpiece.

3. The method of claim 2 wherein absorbing comprises absorbing the radiation at a radiation absorbing surface.

4. The method of claim 3 wherein absorbing comprises absorbing the radiation at a wall of a radiation absorbing chamber.

5. The method of claim 2 wherein absorbing comprises absorbing the radiation thermally emitted by the workpiece at a selective-filtering system.

6. The method of claim 5 wherein pre-heating the workpiece comprises transmitting radiation produced by an irradiance source through a filtering device of the selective-filtering system to the workpiece.

7. The method of claim 6 wherein transmitting comprises transmitting the radiation to a second surface of the workpiece.

8. The method of claim 5 wherein heating the surface of the workpiece comprises transmitting radiation produced by an irradiance source through a filtering device of the selective-filtering system to the surface of the workpiece.

9. The method of claim 5 further comprising cooling the selective-filtering system.

10. The method of claim 9 wherein cooling the selective-filtering system comprises causing a liquid to flow across a surface of a window of the selective-filtering system.

11. The method of claim 9 wherein cooling the selective-filtering system comprises causing a liquid to flow in a space defined between first and second spaced apart windows of the selective-filtering system.

12. The method of claim 1 wherein heating the surface comprises rapidly heating the surface to the desired temperature by activating a source of thermal flux or adiabatic energy.

13. The method of claim 12 further comprising deactivating the source of thermal flux or adiabatic energy.

14. The method of claim 1, wherein pre-heating the workpiece to the intermediate temperature comprises pre-heating the workpiece to a temperature in the range of 600° C. to 1250° C.

15. The method of claim 1, wherein heating the surface of the workpiece to the desired temperature comprises heating the surface to a temperature in the range of 1050° C. to 1430° C.

16. The method of claim 1, wherein pre-heating comprises pre-heating the workpiece for a time period greater than a thermal conduction time of the workpiece.

17. The method of claim 1, wherein heating the surface of the workpiece comprises commencing said heating substantially immediately when the workpiece reaches the intermediate temperature.

18. The method of claim 17 wherein commencing comprises commencing said heating within an interval following the arrival of the workpiece at the intermediate temperature, the interval having a duration less than or equal to a thermal conduction time of the workpiece.

19. The method of claim 1, wherein the workpiece is a semiconductor wafer.

20. The method of claim 1, wherein pre-heating comprises pre-heating the workpiece at a rate of at least 100° C. per second.

21. The method of claim 1, wherein pre-heating comprises irradiating the workpiece with electromagnetic radiation produced by an arc lamp.

22. The method of claim 1, wherein heating comprises irradiating the workpiece with electromagnetic radiation produced by a flash lamp.

23. The method of claim 1, wherein enhancing comprises allowing the workpiece to cool at a rate of at least about 100° C. per second.

24. A system for heat-treating a workpiece, the system comprising:
 a) a pre-heating device operable to pre-heat the workpiece to an intermediate temperature;
 b) a heating device operable to heat an entire surface of the workpiece to a desired temperature greater than the intermediate temperature, within a time period less than a thermal conduction time of the workpiece; and
 c) a cooling enhancement system for enhancing cooling of the workpiece to a temperature below the intermediate temperature.

25. The system of claim 24 wherein said cooling enhancement system comprises an absorption system operable to absorb radiation thermally emitted by the workpiece.

26. The system of claim 25 wherein said absorption system comprises a radiation absorbing surface.

27. The system of claim 26 wherein said radiation absorbing surface comprises a wall of a radiation absorbing chamber.

28. The system of claim 25 wherein said absorption system comprises a selective-filtering system.

29. The system of claim 28 wherein said selective-filtering system comprises a filtering device interposed between said pre-heating device and the workpiece and configured to transmit radiation produced by said pre-heating device to the workpiece.

30. The system of claim 29 wherein said filtering device is configured to transmit the radiation to a second surface of the workpiece.

31. The system of claim 28 wherein said selective-filtering system comprises a filtering device interposed between said heating device and the workpiece and configured to transmit radiation produced by said heating device to the surface of the workpiece.

32. The system of claim 28 further comprising a cooling subsystem for cooling said selective-filtering system.

33. The system of claim 32 wherein said selective-filtering system comprises at least one window, and wherein said cooling subsystem comprises a liquid-cooling subsystem for causing a liquid to flow across a surface of said window.

34. The system of claim 32 wherein said selective-filtering system comprises first and second spaced apart windows, and wherein said cooling subsystem comprises a liquid-cooling subsystem for causing a liquid to flow in a space defined between said windows.

35. The system of claim 24 wherein the heating device comprises a source of thermal flux or adiabatic energy operable to rapidly heat the surface to the desired temperature.

36. The system of claim 24, wherein said pre-heating device is operable to pre-heat the workpiece to a temperature in the range of 600° C. to 1250° C.

37. The system of claim 24 wherein said heating device is operable to heat the surface to a temperature in the range of 1050° C. to 1430° C.

38. The system of claim 24, wherein said pre-heating device is operable to pre-heat the workpiece for a time period greater than a thermal conduction time of the workpiece.

39. The system of claim 24, wherein said heating device is operable to commence heating the surface substantially immediately when the workpiece reaches the intermediate temperature.

40. The system of claim 39, wherein said heating device is operable to commence heating the surface within an interval following the arrival of the workpiece at the intermediate temperature, the interval having a duration less than or equal to a thermal conduction time of the workpiece.

41. The system of claim 24, wherein the workpiece is a semiconductor wafer.

42. The system of claim 24, wherein said pre-heating device is operable to pre-heat the workpiece at a rate of at least 100° C. per second.

43. The system of claim 24, wherein said pre-heating device comprises an arc lamp operable to irradiate the workpiece with electromagnetic radiation.

44. The system of claim 24, wherein said heating device comprises a flash lamp operable to irradiate the workpiece with electromagnetic radiation.

45. The system of claim 24, wherein said cooling enhancement system allows the workpiece to cool at a rate of at least about 100° C. per second.

46. A system for heat-treating a workpiece, the system comprising:
 a) means for pre-heating the workpiece to an intermediate temperature;
 b) means for heating an entire surface of the workpiece to a desired temperature greater than the intermediate temperature, within a time period less than a thermal conduction time of the workpiece; and
 c) means for enhancing cooling of the workpiece.

47. The system of claim 46 wherein said means for enhancing comprises means for absorbing radiation thermally emitted by the workpiece.

48. A selective-filtering system for use in heat-treating a workpiece, the system comprising:
 a) a first filtering device configured to transmit radiation from a pre-heating device to the workpiece to pre-heat the workpiece to an intermediate temperature, and configured to absorb radiation thermally emitted by the workpiece; and b) a second filtering device configured to transmit radiation from a heating device to a surface of the workpiece to heat the surface to a desired temperature greater than the intermediate temperature, and configured to absorb radiation thermally emitted by the workpiece.

49. The system of claim 48 further comprising a cooling subsystem for cooling said first and second filtering devices.

50. The system of claim 48 wherein at least one of said first and second filtering devices comprises a liquid-cooled window.

51. The system of claim 50 wherein said liquid-cooled window comprises a water-cooled quartz window.

52. A method of heat-treating a workpiece, the method comprising:
   a) pre-heating the workpiece to an intermediate temperature; and
   b) heating a surface of the workpiece to a desired temperature greater than the intermediate temperature, said heating commencing substantially immediately when the workpiece reaches the intermediate temperature.

53. The method of claim 52 wherein heating the surface of the workpiece comprises commencing said heating within less than one second after the workpiece reaches the intermediate temperature.

54. The method of claim 52 wherein heating the surface of the workpiece comprises commencing said heating within less than one-quarter second after the workpiece reaches the intermediate temperature.

55. The method of claim 52 wherein heating the surface of the workpiece comprises commencing said heating within less than $1 \times 10^2$ milliseconds after the workpiece reaches the intermediate temperature.

56. The method of claim 52 wherein heating the surface of the workpiece comprises commencing said heating within less than $1 \times 10^1$ milliseconds after the workpiece reaches the intermediate temperature.

57. The method of claim 52 wherein heating the surface of the workpiece comprises commencing said heating within an interval following the arrival of the workpiece at the intermediate temperature, the interval having a duration less than or equal to a thermal conduction time of the workpiece.

58. The method of claim 52 wherein the pre-heating comprises pre-heating the workpiece for a time period greater than a thermal conduction time of the workpiece.

59. The method of claim 52 wherein heating comprises heating the surface for a time period less than a thermal conduction time of the workpiece.

60. The method of claim 52 wherein heating comprises commencing said heating in response to an indication that the temperature of the workpiece is at least the intermediate temperature.

61. The method of claim 52 further comprising producing the indication.

62. The method of claim 52 wherein pre-heating comprises irradiating the workpiece.

63. The method of claim 62 wherein irradiating comprises exposing the workpiece to electromagnetic radiation produced by an arc lamp.

64. The method of claim 62 wherein irradiating comprises exposing the workpiece to electromagnetic radiation produced by at least one filament lamp.

65. The method of claim 52 wherein pre-heating comprises pre-heating the workpiece at a rate of at least 100° C. per second.

66. The method of claim 52 wherein pre-heating comprises pre-heating the workpiece at a rate of at least 400° C. per second.

67. The method of claim 52 wherein heating the surface of the workpiece comprises irradiating the surface.

68. The method of claim 67 wherein irradiating comprises exposing the surface to electromagnetic radiation produced by a flash lamp.

69. The method of claim 67 wherein irradiating comprises moving a laser beam across the surface.

70. The method of claim 52 further comprising absorbing radiation reflected and thermally emitted by the workpiece.

71. The method of claim 70 wherein absorbing comprises absorbing the radiation in a radiation absorbing environment.

72. The method of claim 70 wherein absorbing comprises absorbing the radiation in at least one radiation absorbing surface.

73. The method of claim 72 further comprising cooling the at least one radiation absorbing surface.

74. A system for heat-treating a workpiece, the system comprising:
   a) a pre-heating device operable to pre-heat the workpiece to an intermediate temperature; and
   b) a heating device operable to heat a surface of the workpiece to a desired temperature greater than the intermediate temperature, and operable to commence the heating of the surface substantially immediately when the workpiece reaches the intermediate temperature.

75. The system of claim 74 wherein said heating device is operable to commence the heating of the surface within less than one second after the workpiece reaches the intermediate temperature.

76. The system of claim 74 wherein said heating device is operable to commence the heating of the surface within less than one-quarter second after the workpiece reaches the intermediate temperature.

77. The system of claim 74 wherein said heating device is operable to commence the heating of the surface within less than $1 \times 10^2$ milliseconds after the workpiece reaches the intermediate temperature.

78. The system of claim 74 wherein said heating device is operable to commence the heating of the surface within less than $1 \times 10^1$ milliseconds after the workpiece reaches the intermediate temperature.

79. The system of claim 74 wherein said heating device is operable to commence the heating of the surface within an interval following the arrival of the workpiece at the intermediate temperature, the interval having a duration less than or equal to a thermal conduction time of the workpiece.

80. The system of claim 74 wherein said pre-heating device is operable to pre-heat the workpiece for a time period greater than a thermal conduction time of the workpiece.

81. The system of claim 74 wherein said heating device is operable to heat the surface for a time period less than a thermal conduction time of the workpiece.

82. The system of claim 74 further comprising a temperature indicator operable to produce an indication of a temperature of the workpiece.

83. The system of claim 82 wherein said heating device is operable to commence the heating in response to an indication from said temperature indicator that the temperature of the workpiece is at least the intermediate temperature.

84. The system of claim 74 wherein said pre-heating device comprises means for irradiating the workpiece.

85. The system of claim 74 wherein said pre-heating device comprises an irradiance source operable to irradiate the workpiece.

86. The system of claim 85 wherein said irradiance source comprises an arc lamp.

87. The system of claim 85 wherein said irradiance source comprises at least one filament lamp.

88. The system of claim 74 wherein said pre-heating device comprises a hot body locatable to pre-heat the workpiece.

89. The system of claim 74 wherein said pre-heating device is operable to pre-heat the workpiece at a rate of at least 100° C. per second.

90. The system of claim 74 wherein said pre-heating device is operable to pre-heat the workpiece at a rate of at least 400° C. per second.

91. The system of claim 74 wherein said heating device comprises means for irradiating the surface.

92. The system of claim 74 wherein said heating device comprises an irradiance source operable to irradiate the surface.

93. The system of claim 92 wherein said irradiance source comprises a flash lamp.

94. The system of claim 91 wherein said irradiance source comprises a laser.

95. The system of claim 74 further comprising a radiation absorbing environment operable to absorb radiation reflected and thermally emitted by the workpiece.

96. The system of claim 74 further comprising at least one radiation absorbing surface operable to absorb radiation reflected and thermally emitted by the workpiece.

97. The system of claim 96 further comprising a cooling subsystem operable to cool said at least one radiation absorbing surface.

98. A system for heat-treating a workpiece, the system comprising:
  a) means for pre-heating the workpiece to an intermediate temperature; and
  b) means for heating a surface of the workpiece to a desired temperature greater than the intermediate temperature, comprising means for commencing the heating substantially immediately when the workpiece reaches the intermediate temperature.

99. The system of claim 98 wherein said means for commencing comprises means for commencing the heating within less than one second after the workpiece reaches the intermediate temperature.

100. The system of claim 98 wherein said means for commencing comprises means for commencing the heating within less than one-quarter second after the workpiece reaches the intermediate temperature.

101. The system of claim 98 wherein said means for commencing comprises means for commencing the heating within less than $1 \times 10^1$ milliseconds after the workpiece reaches the intermediate temperature.

102. The system of claim 98 wherein said means for commencing comprises means for commencing the heating within an interval following the arrival of the workpiece at the intermediate temperature, the interval having a duration less than or equal to a thermal conduction time of the workpiece.

103. A semiconductor heating apparatus, comprising:
  a first heating source for heating a first surface of a semiconductor wafer to heat the wafer to an intermediate temperature;
  a second heating source for heating an entire second surface of the semiconductor wafer within a time period less than a thermal conduction time of the wafer, to heat the second surface to a desired temperature greater than the intermediate temperature; and
  a first cooled window disposed between the first heating source and the semiconductor wafer.

104. The semiconductor heating apparatus of claim 103, wherein the first cooled window comprises a first optically transparent plate cooled by a cooling fluid.

105. The semiconductor heating apparatus of claim 104, wherein the first cooled window further comprises a second optically transparent plate separated from the first optically transparent plate to define a passageway through which the cooling fluid may flow.

106. The semiconductor heating apparatus of claim 104, wherein the cooling fluid is water.

107. The semiconductor heating apparatus of claim 104, wherein the first optically transparent plate is formed from quartz.

108. The semiconductor heating apparatus of claim 105, wherein the second optically transparent plate is formed from quartz.

109. The semiconductor heating apparatus of claim 103, further comprising a second cooled window disposed between the second heating source and the semiconductor wafer.

110. The semiconductor heating apparatus of claim 103, wherein the first cooled window absorbs radiation thermally emitted by the semiconductor wafer.

111. The semiconductor heating apparatus of claim 110, wherein the first cooled window absorbs radiation to controllably cool the semiconductor wafer at a rate of at least 100° C. per second.

112. The semiconductor heating apparatus of claim 109, wherein the second cooled window absorbs radiation to controllably cool the semiconductor wafer at a rate of at least 100° C. per second.

113. The semiconductor heating apparatus of claim 103, wherein the first heating source includes an arc lamp.

114. The semiconductor heating apparatus of claim 103, wherein the second heating source includes an arc lamp.

115. The semiconductor heating apparatus of claim 103, wherein the first heating source is a tungsten lamp or array of tungsten lamps.

116. The semiconductor heating apparatus of claim 103, further comprising a chamber housing the semiconductor wafer, wherein said chamber has one or more walls with a radiation-absorbing surface.

117. The semiconductor heating apparatus of claim 103, further comprising a chamber housing the semiconductor wafer, wherein said chamber has one or more walls with a radiation-reflecting surface.

118. The semiconductor heating apparatus of claim 117, wherein said chamber walls are inwardly tapered at an angle from 2 to 6 degrees from perpendicular.

* * * * *